United States Patent
Saito et al.

(10) Patent No.: US 11,671,032 B2
(45) Date of Patent: Jun. 6, 2023

(54) CONTROL METHOD FOR CONTROLLING RESONANCE POWER CONVERTER, AND RESONANCE POWER CONVERTER

(71) Applicant: NISSAN MOTOR CO., LTD., Yokohama (JP)

(72) Inventors: Kousuke Saito, Kanagawa (JP); Toshihiro Kai, Kanagawa (JP); Shigeharu Yamagami, Kanagawa (JP); Keisuke Inoue, Kanagawa (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 99 days.

(21) Appl. No.: 17/048,279

(22) PCT Filed: Apr. 20, 2018

(86) PCT No.: PCT/IB2018/000567
§ 371 (c)(1),
(2) Date: Oct. 16, 2020

(87) PCT Pub. No.: WO2019/202352
PCT Pub. Date: Oct. 24, 2019

(65) Prior Publication Data
US 2021/0044218 A1 Feb. 11, 2021

(51) Int. Cl.
*H02M 7/539* (2006.01)
*H02M 7/5395* (2006.01)
(Continued)

(52) U.S. Cl.
CPC .... *H02M 7/5395* (2013.01); *G01R 19/16538* (2013.01); *H02M 1/32* (2013.01);
(Continued)

(58) Field of Classification Search
None
See application file for complete search history.

(56) References Cited

U.S. PATENT DOCUMENTS 5,615,100 A   3/1997 Radecker et al.
8,830,702 B2 * 9/2014 Macfarlane ......... H02M 1/4225
                                                  363/19

(Continued)

FOREIGN PATENT DOCUMENTS

JP         2016-22709 A      2/2016

*Primary Examiner* — Jeffrey A Gblende
(74) *Attorney, Agent, or Firm* — Foley & Lardner LLP

(57) ABSTRACT

A control method of controlling a resonance type power conversion device including a voltage resonance circuit is provided. The voltage resonance circuit comprising, a choke coil connected to input power supply, a first switching element connected to the choke coil, a capacitor connected in parallel to the first switching element, and a resonance circuit connected between a connection point and an output terminal, the connection point being a point at which the choke coil and the first switching element are connected. The control method comprising, detecting a polarity of current flowing through parallel circuit connected in parallel to the first switching element by using a sensor included in the voltage resonance circuit; and controlling an operating condition of the first switching element depending on a polarity of the current detected by the sensor.

5 Claims, 27 Drawing Sheets

(51) Int. Cl.
  *G01R 19/165* (2006.01)
  *H02M 1/32* (2007.01)
  *H02M 1/00* (2006.01)
  *H02M 7/48* (2007.01)
(52) U.S. Cl.
  CPC ........ *H02M 1/0009* (2021.05); *H02M 1/0058* (2021.05); *H02M 1/327* (2021.05); *H02M 7/4818* (2021.05)

(56) References Cited

U.S. PATENT DOCUMENTS

| | | | |
|---|---|---|---|
| 9,112,429 B2* | 8/2015 | Ikeda | H02M 7/5387 |
| 9,525,358 B2* | 12/2016 | Jin | H02M 1/38 |
| 9,634,572 B2* | 4/2017 | Jin | H02M 3/157 |
| 2012/0169240 A1 | 7/2012 | MacFarlane | |
| 2013/0043951 A1 | 2/2013 | Irish et al. | |
| 2013/0188408 A1 | 7/2013 | Yamamoto | |
| 2018/0006566 A1* | 1/2018 | Bronson | H03K 17/165 |

* cited by examiner

CONTROL METHOD FOR CONTROLLING RESONANCE POWER CONVERTER, AND RESONANCE POWER CONVERTER

TECHNICAL FIELD

The present invention relates to a resonance type power conversion device and a control method for controlling the resonance type power conversion device.

BACKGROUND ART

Conventionally, there is known a wireless power transfer device comprising and a monitoring circuit and an E-type amplifier circuit including a switching element. This wireless power transfer device switches the switching element to the open position during the first transfer and switched the switching element to the close position when determining that the value indicating the voltage of the switching element is below the threshold value, to perform zero volt switching.

CITATION LIST

Patent Document

JP-2016-22709 A

SUMMARY OF THE INVENTION

Problem to be Solved by the Invention

However, in control method of the switching element as described above, the switching element, under a state of high-speed on, repeated off, by monitoring the voltage change of the switching element, the voltage of the switching element is less than the threshold since it must detect a limited time, it becomes difficult to continuously perform zero-volt switching, there is a problem that the switching loss is increased.

An object to be solved by the present invention is to provide a control method and resonance type power conversion device for controlling resonance type power conversion device, which can suppress switching losses.

Means for Solving Problem

The present invention detects a polarity of current flowing through parallel circuit connected in parallel to a first switching element by using a sensor included in a voltage resonance circuit; and controls an operating condition of a first switching element depending on the polarity of the current detected by the sensor to solve the above problem.

Effect of the Invention

According to the present invention, it is possible to reduce the switching loss.

BRIEF DESCRIPTION OF DRAWING(S)

MODE(S) FOR CARRYING OUT THE INVENTION

Hereinafter, an embodiment of the present invention is explained with reference to the drawings.

First Embodiment

Figure 1:
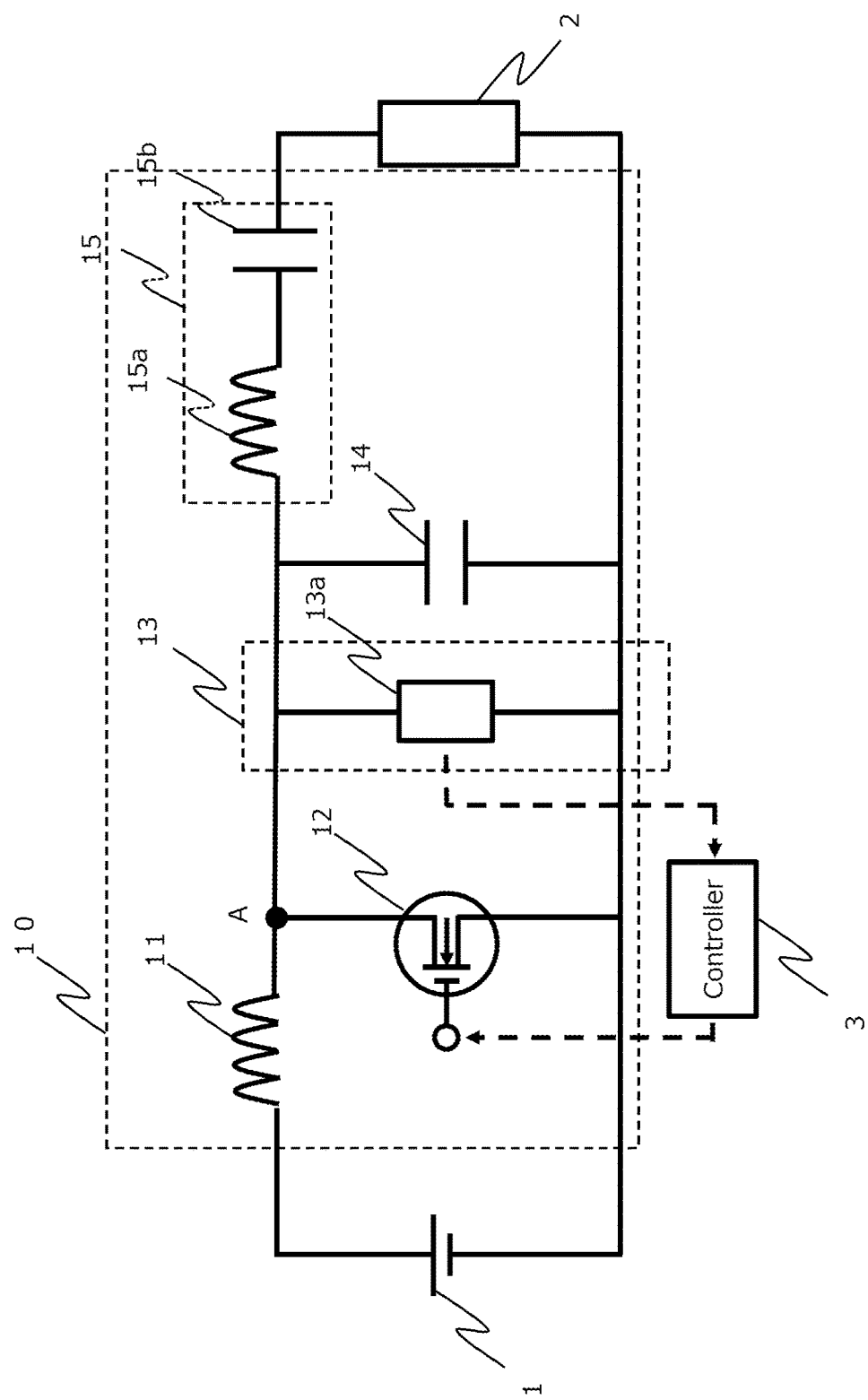
FIG. 1 is a block diagram of a resonance type power conversion device according to an embodiment of the present invention.

Control method for controlling a resonance type power conversion device and the resonance type power conversion device according to the present invention is explained below. FIG. 1 is a schematic diagram of the resonance type power conversion device. The resonance type power conversion device includes an input power supply 1, a load 2, a controller 3, and a voltage resonance circuit 10. Input power supply 1 is connected to the inputs of the voltage resonance circuit 10. The input power supply 1 is, for example, a constant-voltage source of direct current. The load 2 is connected to the output of the voltage resonance circuit 10. A pair of power supply lines is connected between input power supply 1 and load 2, the power supply line on the positive electrode side is connected between the positive electrode of the input power supply 1 and the load 2, and the power supply line on the negative electrode side is connected between the negative electrode of the input power supply 1 and the load 2. Load 2 is a motor, etc., and is connected to an output terminal of a voltage resonance circuit. The controller 3 converts the power input from input power supply 1 by controlling on and off of the switching element 12 included in voltage resonance circuit 10 and outputs the converted power to Load 2.

The voltage resonance circuit 10 is E class inverter-circuit and has a choke coil 11, a switching element 12, a parallel circuit 13, a capacitor 14, and a resonance circuit 15. The choke coil 11 is connected to the positive electrode of the input power supply 1. The switching element 12 is a transistor (switching device) such as a MOSFET. Note that, in the following description, MOSFET is used as switching element 12. A higher potential side terminal (Drain Terminal) of the switching element 12 is connected to a connection point A, and a lower potential side terminal (Source Terminal) of the switching element 12 is connected to a power line on the negative side. The connection point A is pointed on the power line on the positive side and a point at which the choke coil 11 and switching element 12 are connected.

The parallel circuit 13 is a circuit connected in parallel to the switching element 12, and is a connection circuit for connecting between the positive power supply line and the negative power supply line. The Sensor 13a is connected to the parallel circuit 13. The sensor 13a detects current flowing through the parallel circuit 13 and outputs the detected values to the controller 3.

Capacitor 14 is connected in parallel to the switching element 12 and is connected between the power supply line on the positive side and the power supply line on the negative side. The choke coil 11 and the capacitor 14 form an amplifier circuit. The resonance circuit 15 is an LC resonance circuit connected resonant coil 15a and the resonant capacitor 15b in series. The resonance circuit 15 is connected between the switching element 12 and the load 2. Note that, resonance circuit 15 is not limited to an LC series circuit in which LCs are connected in series, as shown in FIG. 1, but may be another resonance circuit.

The controller 3 outputs a drive signal to the control terminal (gate terminal) of the switching element 12. The drive signal is a signal for switching the switching element 12 on and off. The drive signal is represented by a square wave. The controller 3 detects polarity of current flowing in parallel circuit 13 by the positive and negative values of the detected current detected by the sensor 13a. The controller 3 controls operating condition of the switching element 12 depending on the polarity of the power detected by sensor 13a. The operating condition of the switching element 12 specifies the switching timing when switching element 12 is switched on and off by predetermined period. In other words, changing operating condition of the switching element 12 changes a timing for turn on and/or turn-off of the switching element 12. The controller 3 controls operating condition of the switching element 12 by changing a duty cycle of the drive signals and/or the drive cycle.

Figure 2:
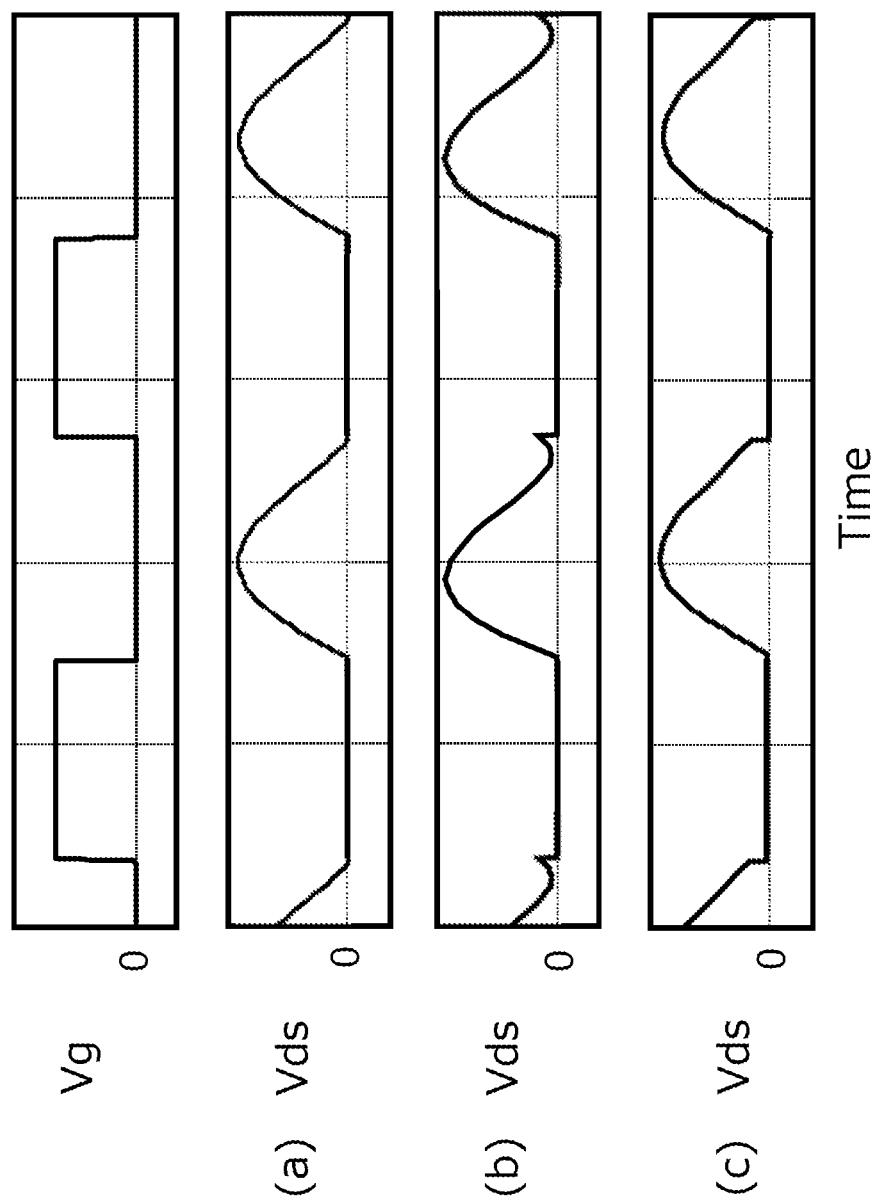
FIG. 2 is a graph showing the voltage current characteristics in the resonance type power conversion device shown in FIG. 1.

Referring to FIG. 2, the driving signals of the switching element 12 and the voltages across the switching element 12 is explained below. FIG. 2 is a graph showing a waveform of the drive signal and a waveform of the voltage applied across switching element 12. Vg denotes the gate-voltage of the switching element 12. Vds denotes the voltage across the switching element 12 (drain-source voltage). When the drive signal is high, switching element 12 is on, and when the drive signal is low, switching element 12 is off. Then, when the drive signal switches from high level to low level, switching element 12 is turned on. When the drive signal switches from low level to high level, switching element 12 is turned off.

In resonant amplifiers such as the voltage resonance circuit 10, after the switching element 12 is turned off, the device voltage of the switching element 12 is increased by the charge of capacitor 14. Then, when capacitor 14 switches from charging to discharging, the voltage across switching element 12 drops. That is, after the switching element 12 is turned off, the voltage across switching element 12 changes in a sinusoidal as like rising and falling waveform.

The voltage across switching element 12 rises sinusoidally and then drops, resulting in a zero voltage across switching element 12. Then, when the voltage across switching element 12 is zero, if the drive signal rises, the zero-volt switching (hereinafter, also referred to as ZVS) is satisfied.

The graph shown in FIG. 2 (a) shows the voltage waveform when satisfied ZVS, the graph shown in FIG. 2 (b), (c) shows the voltage waveform when ZVS is not satisfied. As shown in FIG. 2 (a), when ZVS is satisfied, the drive signal rises and switching element 12 is turned on while the voltage across switching element 12 is zero. Therefore, the voltage across switching element 12 changes to zero during the on-period after the voltage across switching element 12 reaches zero.

On the other hand, when timing at the rising edge of the drive signal is delayed from timing at which ZVS is satisfied, the voltage across switching element 12 is a waveform as shown in FIG. 2(b). Further, when timing at the rising edge of the drive signal is earlier than timing at which ZVS holds, the voltage across switching element 12 is a waveform as shown in FIG. 2(c). For example, when the capacitance value of the resonant capacitor 15b is reduced from the capacitance value of the resonant capacitor 15b when the ZVS is satisfied, the voltage across switching element 12 is shifted in a waveform as shown in FIG. 2 (b). Further, when the capacitance value of the resonant capacitor 15b is increased from the capacitance value of the resonant capacitor 15b when satisfied ZVS, the voltage across the switching element 12 is transited in a waveform as shown in FIG. 2 (c).

Then, as shown in FIG. 2 (b) and FIG. 2 (c), while a voltage greater than zero is applied to both ends of the switching element 12, when the switching element 12 is turn on, the switching loss is increased.

Detected values of sensor 13a are decided by the voltage across switching element 12 and the impedance of parallel circuit 13 including sensor 13a. Therefore, controller 3, from the detected value of sensor 13a, or both end voltages of the switching element 12 is a state shown in FIG. 2 (b), both end voltages of the switching element 12 determines whether the state shown in FIG. 2 (c). Then, controller 3 controls operating condition of the switching element 12 so that the voltage across switching element 12 becomes the waveform shown in FIG. 2 (a).

Figure 3:
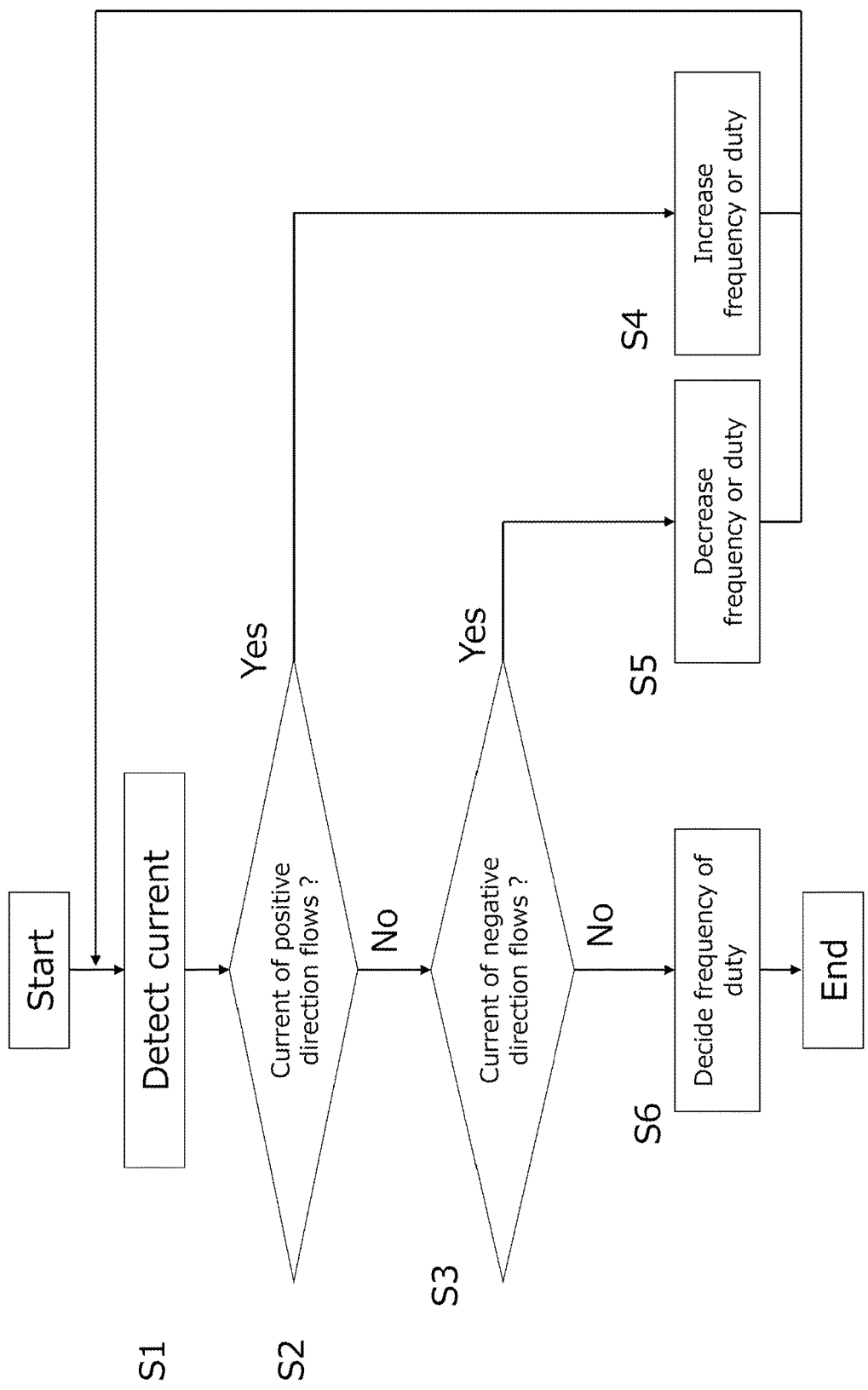
FIG. 3 is a flowchart showing control flows of the controller included in the resonance type power conversion device shown in FIG. 1.

Referring to FIG. 3, illustrating the specific control of the controller 3. FIG. 3 is a flowchart showing control flows of the controller 3. The controller 3, by outputting the drive signal of a predetermined period to the control terminal of the switching element 12, cyclically switches the on-off of the switching element 12. Apart from such switching operation control, the controller 3 executes the following control flows. Note that controller 3 repeatedly executes the control flows shown in FIG. 3 in accordance with timing for turning on the switching element 12.

In step S1, the controller 3 detects current flowing to parallel circuit 13 at timing for turn on the switching element 12 by sensor 13a. In step S2, the controller 3 detects polarity of current detected by sensor 13a, and determines whether or not current of positive direction flows through the parallel circuit 13. When current of positive direction flows through the parallel circuit 13, the controller 3 executes the control flow in step S4. Positive direction is the direction in which current flows from the power supply line on the positive side to the power supply line on the negative side.

When current of positive direction does not flows through the parallel circuit 13, in Step S3, the controller 3 detects polarity of current detected by sensor 13a and determines whether current of negative direction flows through the parallel circuit 13. When current of negative direction flows through the parallel circuit 13, the controller 3 executes the control flow in step S6.

When current of positive direction flows through the parallel circuit 13, since the voltage across switching element 12 is in the state of FIG. 2 (b), in step S4, the controller 3 increases the frequency of the drive signal than the present frequency. Then, the controller 3 executes the control process of step S1.

When current of negative direction flows through the parallel circuit 13, since the voltage across switching element 12 is in the state of FIG. 2 (c), in step S5, controller 3 decreases the frequency of the drive signal lower than the present frequency. Then, the controller 3 executes the control process of step S1.

When current of negative direction and current of positive direction are not flowing through the parallel circuit 13, in Step S6, the controller 3 sets the current frequency to the frequency of the driving signal. Thus, the frequency for satisfying the ZVS is decided. That is, the controller 3, by repeatedly executing the control loop from step S1 to step S5, in timing for turning on the switching element 12, so that current does not flow through the parallel circuit 13, operating condition of the switching element 12 is controlled.

As described above, in this embodiment, the sensor 13a is used to detect polarity of current flowing through the parallel circuit 13, and operating condition of the switching element 12 is controlled depending on polarity of the detected current. When the circuit parameters included in voltage resonance circuit 10 are changed, timing for turning on the switching element 12 deviates from timing when ZVS is satisfied. In this embodiment, by detecting polarity of current flowing in parallel circuit 13, the deviation between timing when ZVS is satisfied and timing for turning on the switching element 12 is identified, so that timing for turning on the switching element 12 matches timing when ZVS is satisfied, operating condition of the switching element 12 is controlled. This reduces the voltage applied to switching element 12 when the switching element 12 is turned on. As a result, the switching loss can be reduced.

In the present embodiment, the controller 3, in the control flow of step S4, increases the duty ratio of the driving signal than the current duty ratio. Further, controller 3, in the control flow of step S5, the duty ratio of the driving signals may be lowered than the current duty ratio. Then, the controller 3, in the control flow of step S6, may sets the current duty ratio to the duty ratio of the driving signal.

In the present embodiment, the controller 3, the control flow of the control flow in step S4 and S5, may be adjusted both the frequency and the duty ratio of the drive signals.

Figure 4:
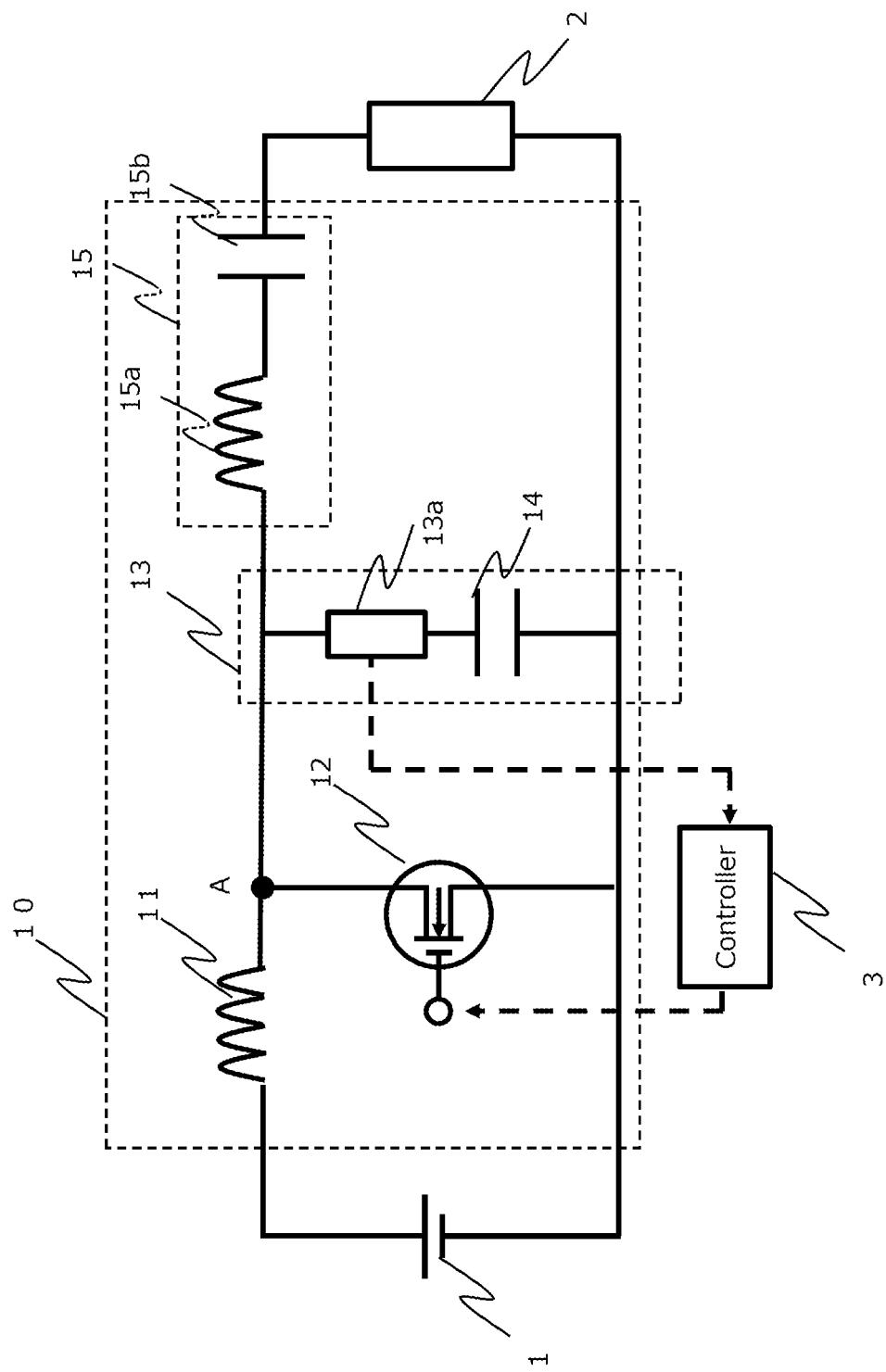
FIG. 4 is a block diagram of a resonance type power conversion device according to an embodiment of the present invention (modification).

As a modification of the present embodiment, as shown in FIG. 4, sensor 13a may be connected in series with respect to capacitor 14. In the example of FIG. 4, the connecting circuits of the sensor 13a and the capacitor 14 correspond to the parallel circuit 13. The controller 3 detects polarity of current of capacitor 14 using sensor 13a, and controls operating condition of the switching element 12 depending on the detection result. The control of operating condition of the switching element 12 is similar to the control flow shown in FIG. 3.

Second Embodiment

Figure 5:
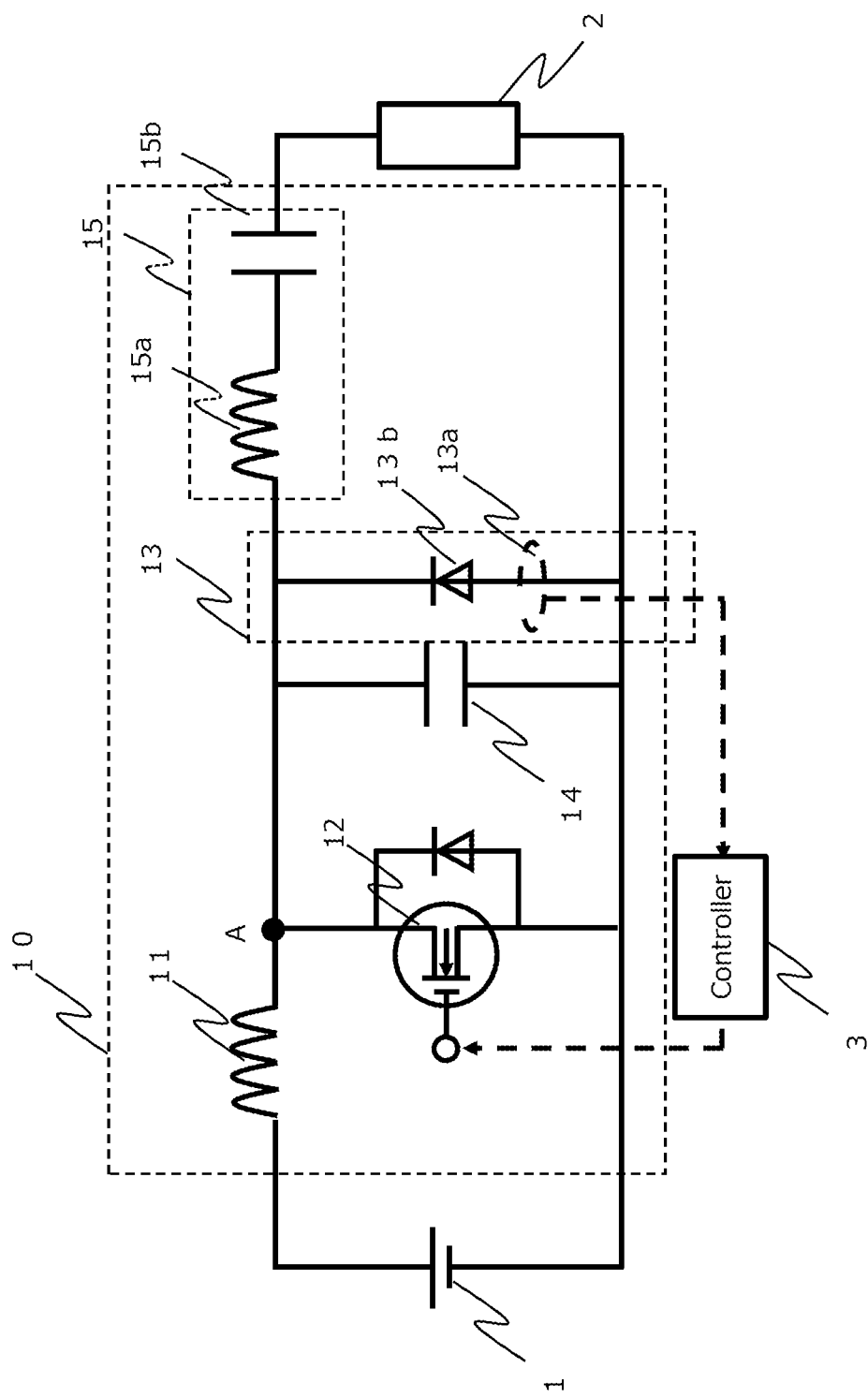
FIG. 5 is a block diagram of a resonance type power conversion device according to another embodiment of the present invention.

FIG. 5 is a block diagram of a resonance type power conversion device according to another embodiment of the present invention. In this example, with respect to the first embodiment described above, the difference is that a diode 13b is provided. Other features are the same as those in the above-described first embodiment and the description thereof is incorporated herein.

A parallel circuit 13 has a sensor 13a and a diode 13b. A parallel circuit 13 is connected between lower potential side and the connection point A of the switching element 12. Conductive direction of the diode 13b is the direction in which the forward direction current flows from lower potential side of the switching element 12 toward the connection point A. That is, the anode of the diode 13b is connected to the power supply line on the negative electrode side, the cathode of the diode 13b is connected to the power supply line on the positive electrode side.

The sensor 13s detects current (hereinafter also referred to as diode current) flowing to diode 13b. The controller 3 outputs a drive signal of a predetermined period to the control terminal of the switching element 12, and switches turn on and turn-off of the switching element 12.

The controller 3 determines whether or not the forward direction current flows to the diode 13a from the detected values detected by the sensor 13a. The controller 3 controls operating condition of the switching element 12 depending on the determination result.

Figure 6A:
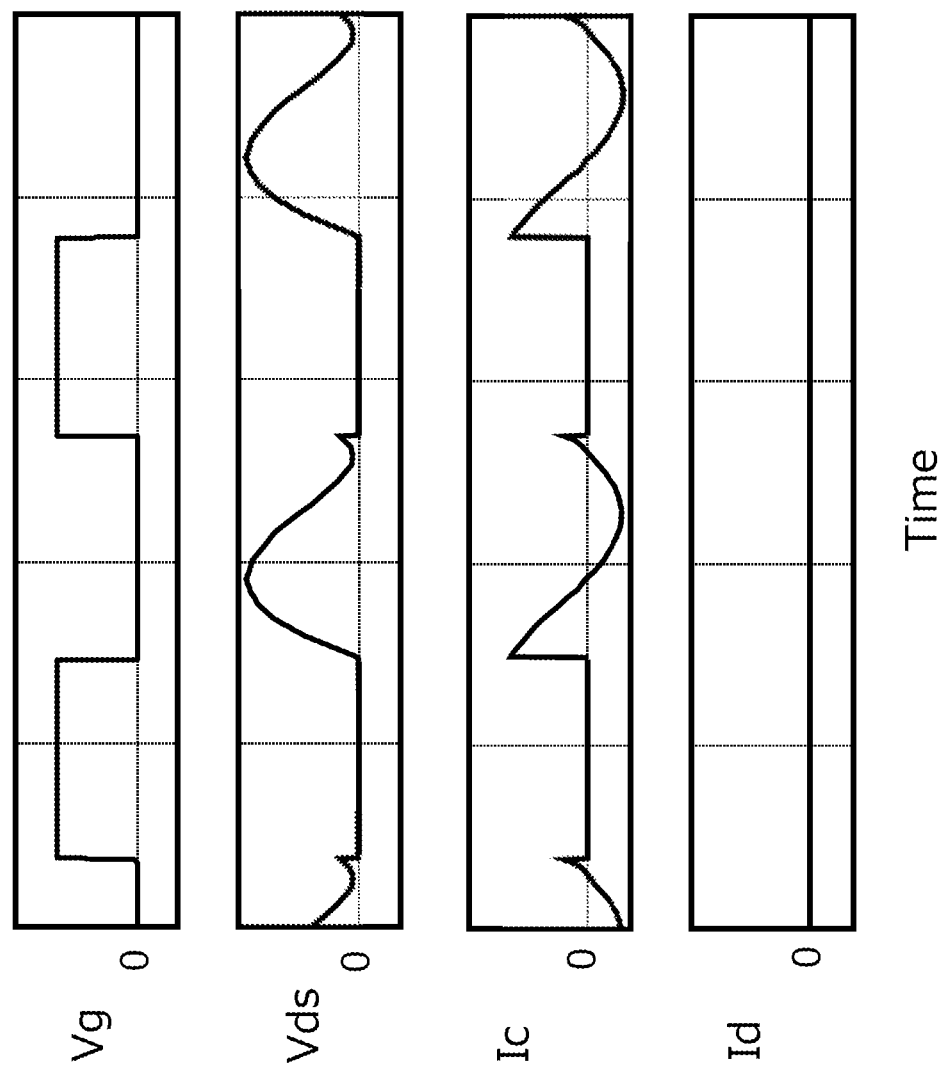
FIG. 6A is a graph showing the voltage current characteristics in the resonance type power conversion device shown in FIG. 5.
Figure 6B:
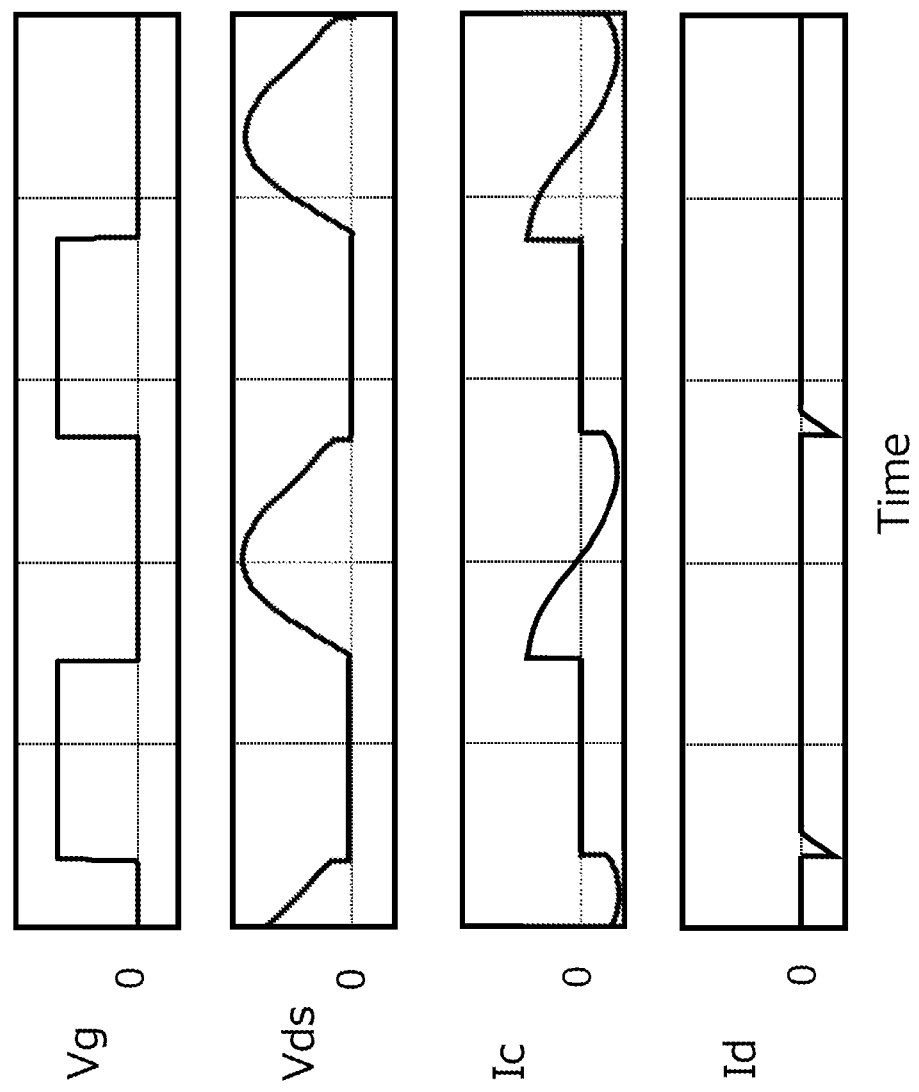
FIG. 6B is a graph showing the voltage current characteristics in the resonance type power conversion device shown in FIG. 5.

Referring to FIG. 6A FIG. and 6B, the driving signal (Vg) of the switching element 12, the voltage (Vds) across the switching element 12, current (Ic) flowing to the capacitor 14, and current (Id) flowing to the diode 13b is explained below. FIG. 2 is a graph showing the characteristics of Vg, Vds, Ic, and Id. In FIG. 6A, 6B, for the positive and negative current (Ic, Id), the direction in which current flows from the positive power line to the negative power line is defined as positive.

For example, when the capacitance value of the resonant capacitor 15b is reduced than the capacitance value of the resonant capacitor 15b when ZVS is satisfied, the form of the voltage (Vds) and current (Ic, Id) is like waveform as shown in FIG. 6A. On the other hand, for example, the capacitance value of the resonant capacitor 15b, when increased than the capacitance value of the resonant capacitor 15b at the time ZVS is satisfied, the form of the voltage (Vds) and current (Ic, Id) is like a waveform as shown in FIG. 6B.

In the case shown in FIG. 6A, immediately before switching element 12 is turned on, the direction of current flowing to capacitor 14 is positive direction. Therefore, the diode current (Id) does not flow after switching element 12 turn on. On the other hand, in the case shown in FIG. 6B, immediately before switching element 12 is turned turn on, the direction of current flowing in capacitor 14 is negative direction. Therefore, diode current (Id) flows after switching element 12 turn on. That is, by detecting whether the forward direction current flows to diode 13b, the controller 3 can determine whether the waveforms of the voltage (Vds) and current (Ic, Id) is the state as shown in FIG. 6A or is the state as shown in FIG. 6B.

Figure 7:
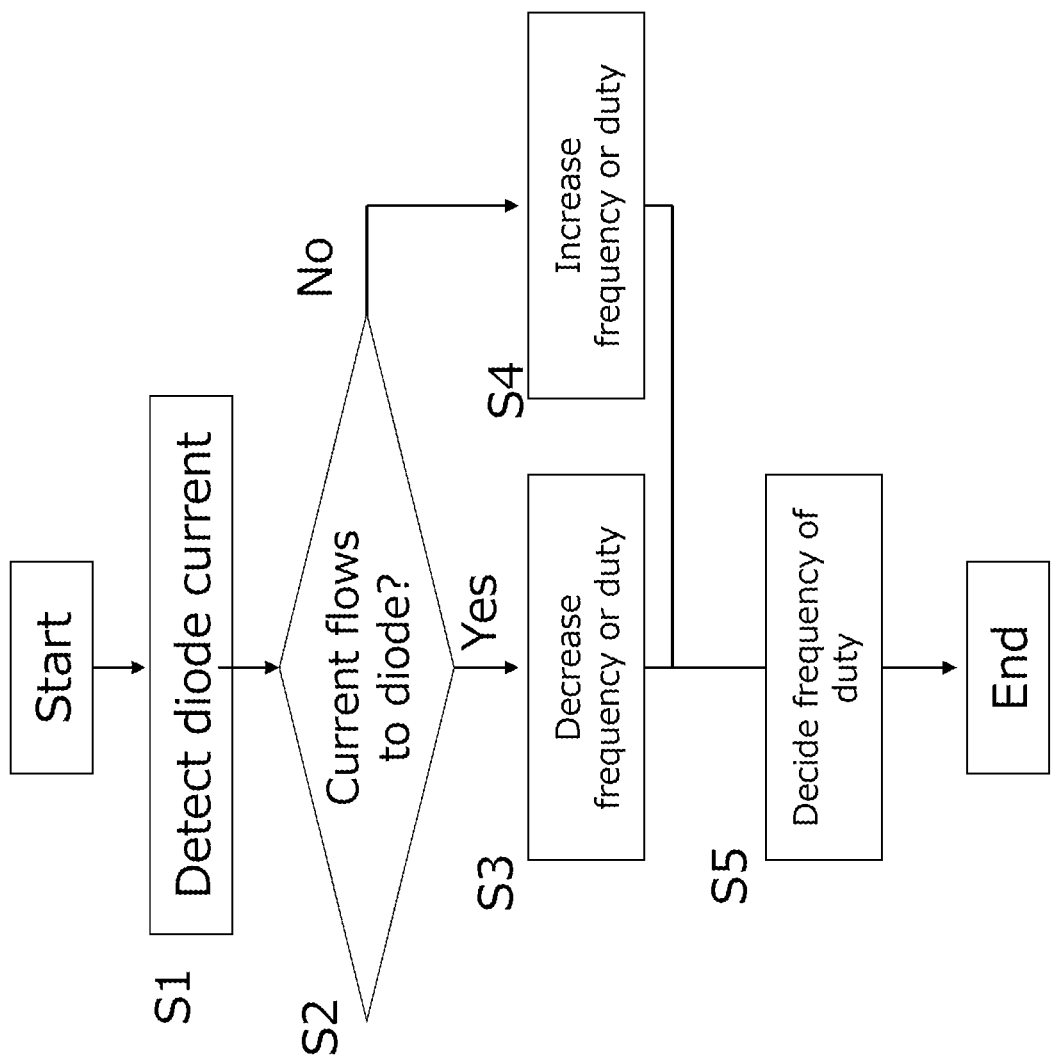
FIG. 7 is a flowchart showing control flows of the controller included in the resonance type power conversion device shown in FIG. 5.

Referring to FIG. 7, the specific control of the controller 3 is explained below. FIG. 7 is a flowchart showing control flows of the controller 3. The controller 3, by outputting a drive signal of a predetermined period to the control terminal of the switching element 12, cyclically switches the on-off of the switching element 12. Apart from such switching operation control, the controller 3 executes the following control flows. Note that, the controller 3, when starting the control of the resonance-side power converter, when the operating state of the load 2 fluctuates, or, at any timing during operation of the resonance-type power resonance device, executes the control flow shown in FIG. 7.

In step S1, the controller 3 detects current flowing through the parallel circuit 13 by the sensor 13a. In step S2, the controller 3 determines whether or not current is flowing through the diode 13b. When the diode current is flowing, the voltage across switching element 12 is in a state as shown in FIG. 6B. In step S3, the controller 3 lowers the frequency of the drive signal below the frequency before the change so that timing for turning on the switching element 12 is slower than timing before the change. When the diode current does not flow, the voltage across switching element 12 is in a state as shown in the FIG. 6A. In step S4, the controller 3 increases the frequency of the drive signal above the frequency before the change so that timing for turn on of the switching element 12 is faster than timing before the change. In step S5, the controller 3 sets the frequency after the change to the frequency of the drive signal.

Figure 8:
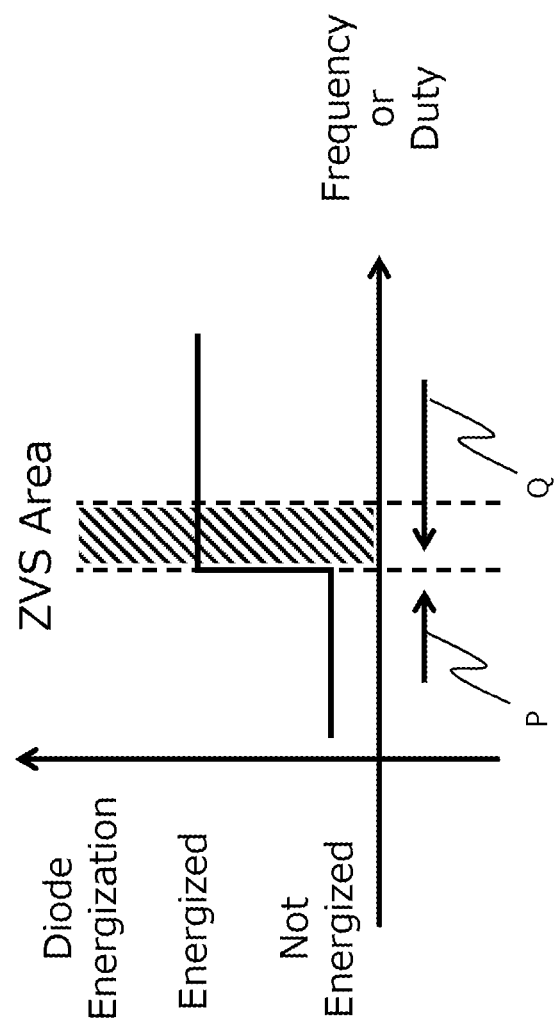
FIG. 8, is a graph for explaining the control of the ZVS satisfied in the resonance type power conversion device shown in FIG. 5.

Referring to FIG. 8, the relationship between the frequencies of the driving signals and the conductive state of the diode 13b is explained below. In the graph of FIG. 8, the ZVS area represents the region in which the drive frequency ZVS is satisfied.

When the frequency of the driving signal becomes higher than the frequency before one period while the forward direction current is not flowing through the diode 13b, as shown by the arrow P in FIG. 8, the frequency of the driving signal approaches the frequency when ZVS is satisfied. Further, when the frequency of the driving signal becomes lower than the frequency before one cycle while the forward direction current is flowing through diode 13b, as shown by the arrow Q in FIG. 8, the frequency of the driving signal approaches the frequency when ZVS is satisfied. Thus, it is possible to reduce the voltage applied to switching element 12 when switching element 12 is turned on.

As described above, in this embodiment, polarity of the diode current flowing to the diode 13b is detected in a state in which switching element 12 is turned on at timing of predetermined period, timing for turning on switching element 12 is made slower than timing of predetermined period when forward direction current flows to the diode 13b, and timing for turn on switching element 12 is made faster than timing of predetermined period when diode current does not flows. Thus, by detecting whether the diode 13b is energized or not energized and adjusting timing for turning on the switching element 13b, it is possible to perform zero-volt switching continuously to suppress the switching losses. Further, in the present embodiment, in order to set the frequency of the driving signal close to the frequency at the time of satisfying ZVS, it can be identified whether the frequency should be increased or decreased by using the result of whether the diode 13b is energized or not energized. Thus, it is possible to adjust the frequency in a direction in which the loss is lowered, for example, it is possible to prevent control such switching loss is further increased by frequency adjustment.

In the present embodiment, the controller 3, in the control flow of step S3, may lower the duty ratio of the driving signal below the current duty ratio. Further, the controller 3, in the control flow of step S4, may increase the duty ratio of the drive signal than the current duty ratio.

In the present embodiment, the controller 3, in the control flows the steps S3 and S4, may adjust both the frequency and the duty ratio of the drive signals.

In the present embodiment, when switching element 12 has a parasitic diode, the forward voltage of the diode 13b may be smaller than the forward voltage of the parasitic diode. Thus, it is possible to flow a lot of current to diode 13b in order to more stably detect diode current. The forward voltage of the diode 13b may be larger than the forward voltage of the parasitic diode. Thus, since current flowing to the diode 13b is suppressed, it is possible to reduce current tolerance of the diode 13b, and it is possible to suppress the costs of the diode 13b.

Third Embodiment

Another embodiment of the present invention is explained below. In the present embodiment, with respect to the second embodiment described above, a part of the control flows is different. Other features are the same as the second embodiment described above, the descriptions of the first and second embodiments are appropriately incorporated.

Figure 9:
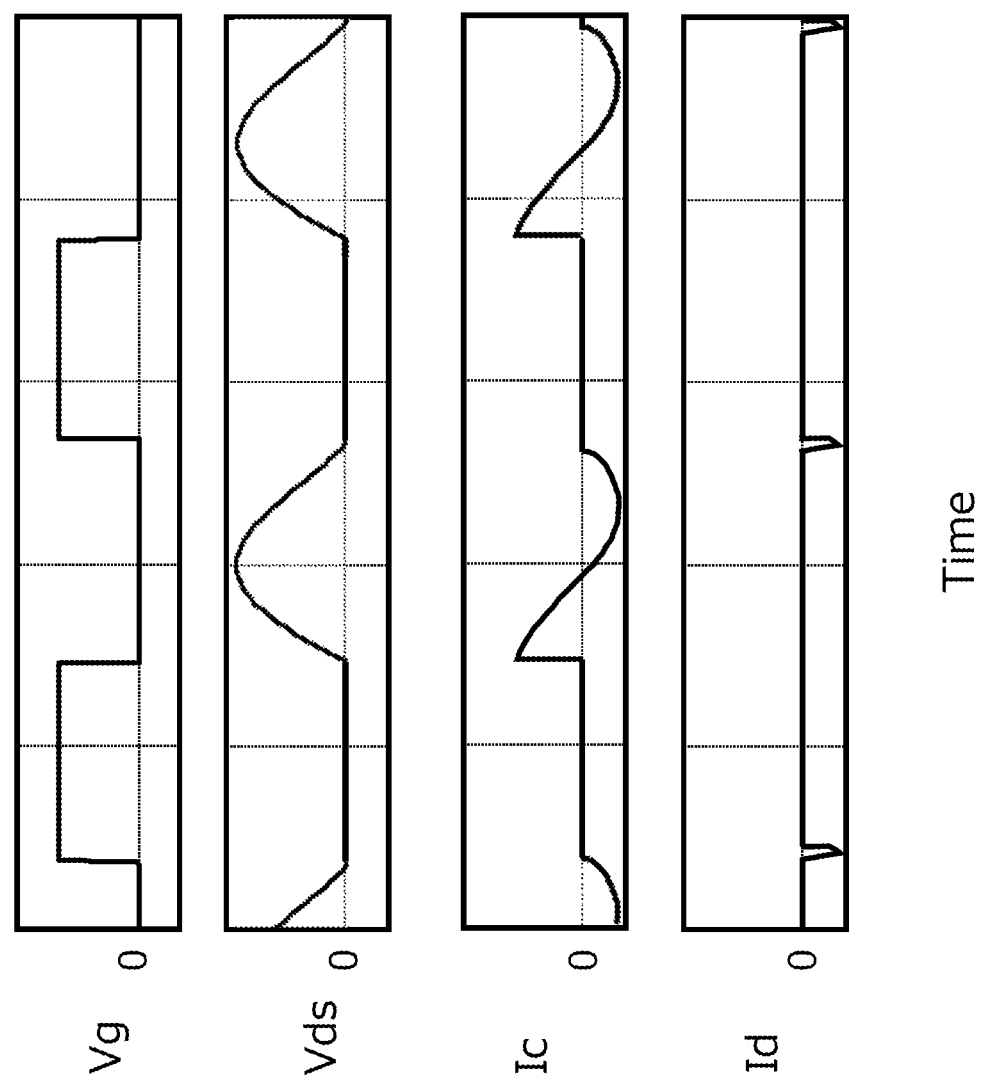
FIG. 9 is a graph showing the voltage current characteristics in the resonance type power conversion device according to an embodiment of the present invention.

FIG. 9 is a graph showing the characteristics of the voltage (Vg, Vds) and current (Ic, Id) when ZVS is satisfied. Vg denotes the gate voltage of the switching element 12, Vds denotes the voltage across the switching element 12, Ic denotes current flowing to the capacitor 14, and Id denotes current flowing to the diode 13b.

As shown in FIG. 9, forward direction current flows to diode 13b even when ZVS is satisfied. From the time when the voltage across the switching element 12 drops to zero until the switching element 12 is turned on, since the reflux current flows to the voltage resonance circuit 10, the diode 13b conducts and forward direction current flows to the diode 13b.

Figure 10:
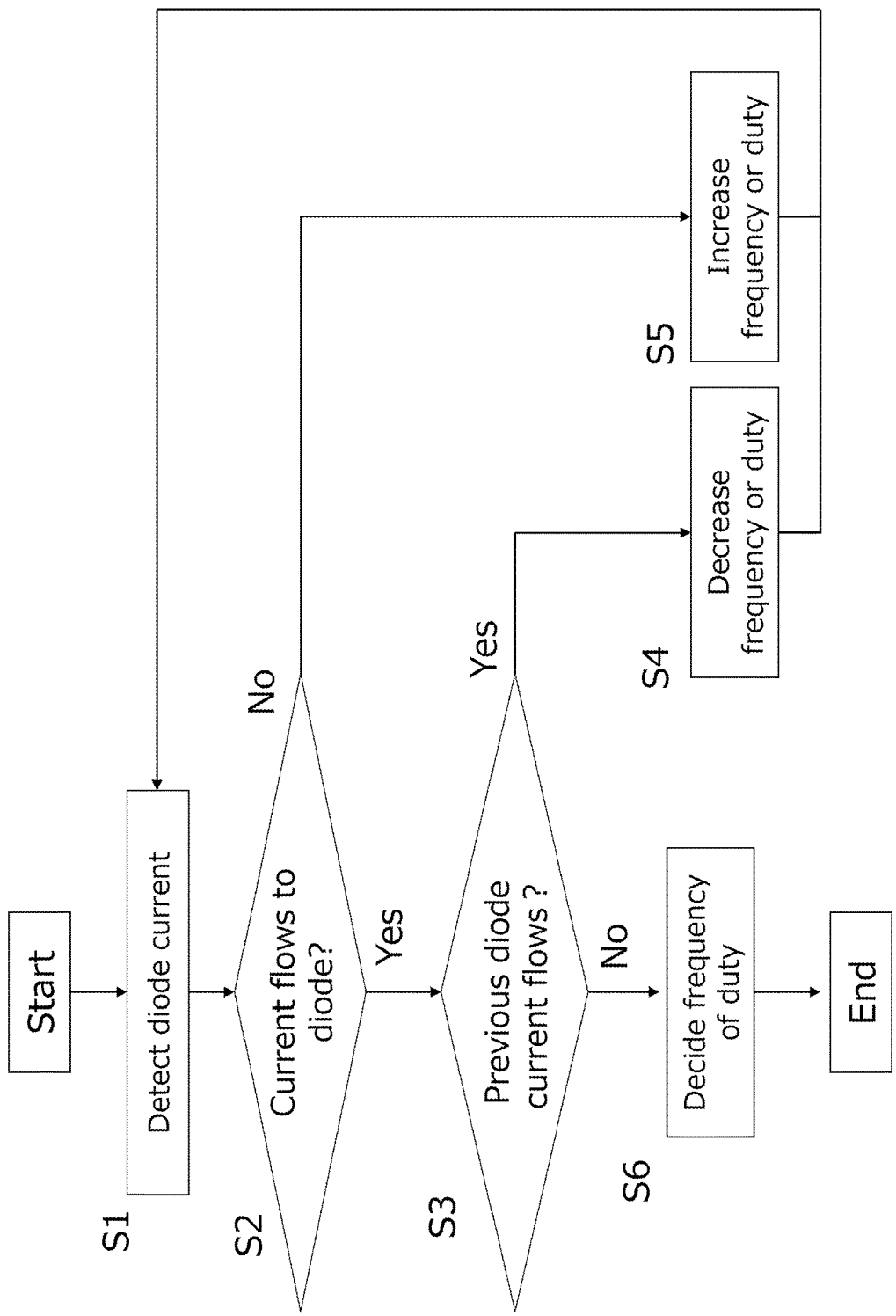
FIG. 10 is a flowchart illustrating control flows of a controller included in the resonance type power conversion device according to an embodiment of the present invention.

Referring to FIG. 10, the specific control of the controller 3 will be described. FIG. 10 is a flowchart showing the control flows of the controller 3. The controller 3, by outputting a drive signal of a predetermined period to the control terminal of the switching element 12, cyclically switches the on-off of the switching element 12. Apart from such switching operation control, the controller 3 executes the following control flows. Note that, the controller 3, when starting the control of the resonance-side power converter, when the operating state of the load 2 fluctuates, or, at any timing during operation of the resonance-type power resonance device, executes the control flow shown in FIG. 10.

In step S1, the controller 3 detects current flowing through the parallel circuit 13 by sensor 13a. In step S2, the controller 3 determines whether or not current flows to diode 13b. When diode current flows, in Step S3, the controller 3 determines whether or not the previous diode current has flowed by using the previous detected value of sensor 13a. The determination in step S3 may use the determination result in step S2 when the control flow shown in FIG. 12 was previously executed. Then, when the previous diode current was flowing, in step S4, the controller 3 lowers the frequency of the drive signal below the previous frequency so that the timing for turning on the switching element 12 is slower than the previous timing.

In the determination in step S2, when it is determined that current does not flow through the diode 13b, in step S5, the controller 3 increases the frequency of the drive signal to be higher than the frequency before the change, and timing to turn on switching element 12 is made faster than timing before the change. That is, by repeating the control loop of step from S1 to S5, the frequency of the drive signal is gradually changed.

In the determination in step S3, when it is determined that the previous diode current does not flow, in step S6, the controller 3 sets the current frequency to the frequency of the driving signal. Thus, the frequency for satisfying the ZVS is decided.

Figure 11:
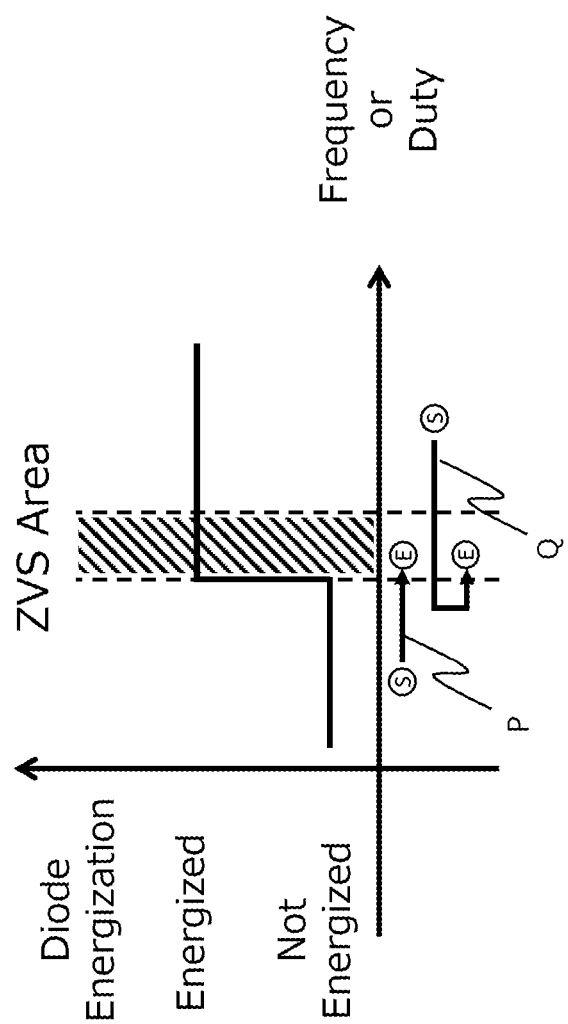
FIG. 11 is a graph for explaining the control of the ZVS satisfied in the resonance type power conversion device according to an embodiment of the present invention.

Referring to FIG. 11, the conductive state of the diode 13b, the relationship between the frequencies of the driving signals will be described. In the graph of FIG. 11, the ZVS area represents the region of the driving frequency at which ZVS is satisfied. Also, S indicates the frequency at the time of control start, E indicates the frequency at the time of control end, i.e. the frequency set in the control flow of step S6.

The frequency of the drive signal is gradually increased from a state lower than the frequency at the time of satisfying ZVS, and the frequency of the drive signal is brought close to the frequency at the time of satisfying ZVS (corresponding to the arrow P in FIG. 11). A gradual increase in the frequency of the drive signals results in a gradual increase in timing for turn on of the switching element 12. Then, when the frequency of the drive signal reaches the frequency when ZVS is satisfied, forward direction current starts to flow to diode 13a. In other words, as shown by the arrow P in FIG. 11, the controller 3 gradually increases the frequency of the drive signal, ZVS is satisfied when shifting from a state in which the diode 13b is not energized to a state in which the diode 13b is energized. Therefore, the controller 3 gradually increases the frequency of the drive signal, by detecting that forward direction current starts flowing by using the detected value of sensor 13a, it is possible to set the frequency when ZVS is satisfied.

The frequency of the drive signal is gradually lowered from a state higher than the frequency at the time of satisfying ZVS, and the frequency of the drive signal is brought close to the frequency at the time of satisfying ZVS (corresponding to the arrow Q in FIG. 11). A gradual decrease in the frequency of the drive signals results in a gradual decrease in timing for turning on the switching element 12. Then, the frequency of the driving signal is lower than the frequency region when ZVS is satisfied, when it is further lowered, the state shifts from the state in which the diode 13b is energized to a state in which the diode 13b is not energized. Then, in the control flow shown in FIG. 10, when the transition from the state in which the diode 13b is energized to a state in which the diode 13b is not energized, the frequency increases. Then, when the frequency of the driving signal is increased, the state shifts from the state in which the diode 13b is not energized to a state in which the diode 13b is energized, and ZVS is satisfied. Therefore, the controller 3 gradually lowers the frequency of the drive signal to detect that a state of the diode 13b is from the state in which the diode 13b is energized to a state in which the diode 13b is not energized. After that, the controller 3 can set the frequency when ZVS is satisfied by increasing the frequency of the drive signal and detecting that the forward direction current starts flowing by using the detected value of the sensor 13a.

In this embodiment, as described above, by changing the timing for turning on the switching element 12, when a state changes from a first state (the diode 13b energized state) in which the forward direction current does not flow to diode 13b to a second state (the diode 13b non-energized state) in which the forward direction current flows to diode 13b, the timing for turning on the switching element 12 is set to the timing changed by second state. Thus, ZVS can be continuously performed, it is possible to suppress the switching loss.

In the present embodiment, controller 3, in the control flow of step S5, the duty ratio of the driving signal may be increased from the current duty ratio. Further, the controller 3, in the control flow of step S4, the duty ratio of the driving signals may be lowered than the current duty ratio.

In the present embodiment, the controller 3, in the control flow of the control flow of the steps S4 and S5, the frequency and the duty ratio of the drive signals may be adjusted.

Fourth Embodiment

Figure 12:
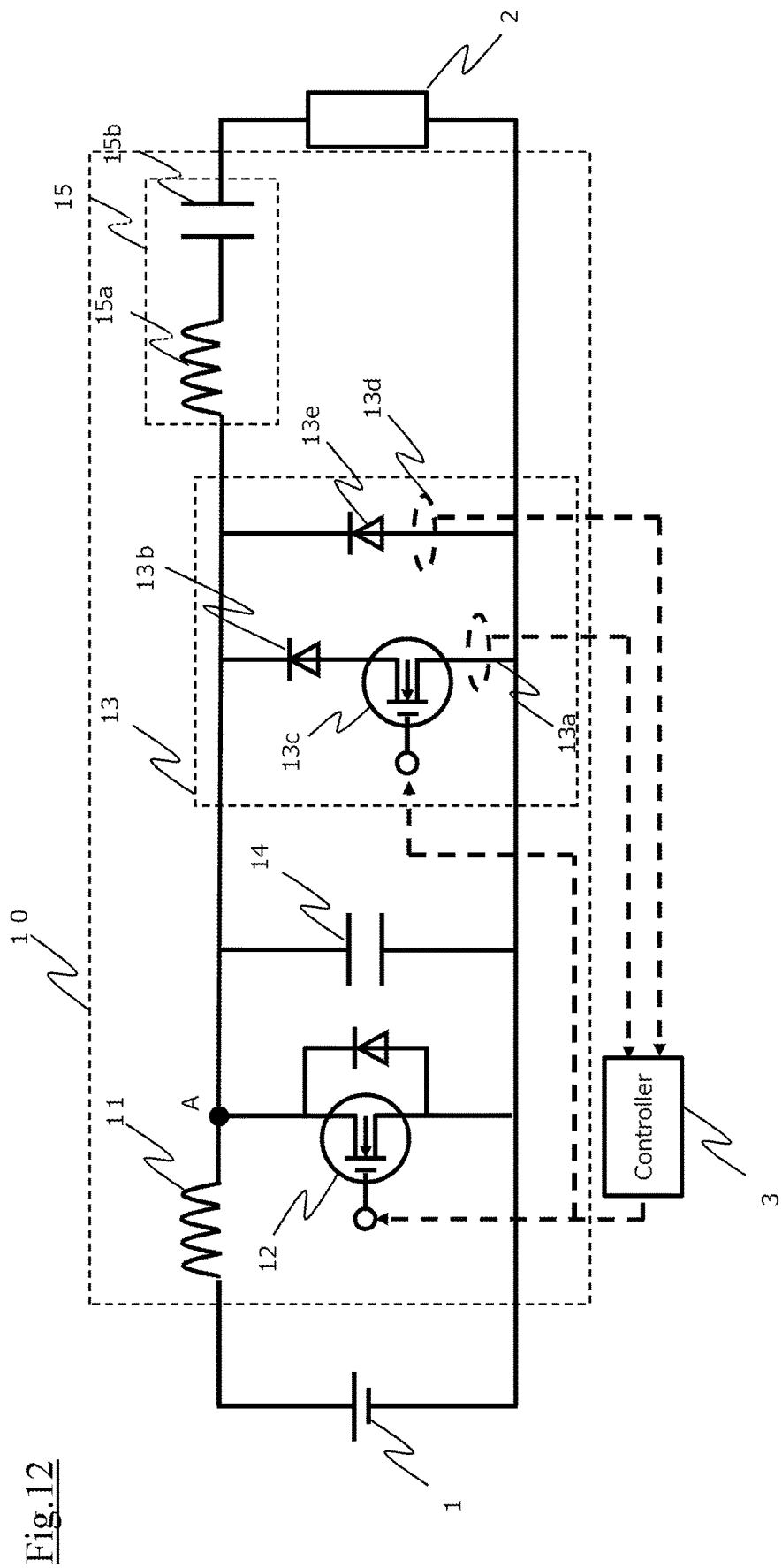
FIG. 12 is a block diagram of a resonance type power conversion device according to another embodiment of the present invention.

FIG. 12 is a block diagram of a resonance type power conversion device according to another embodiment of the present invention. In this example, with respect to the second embodiment described above, the circuit configuration of the parallel circuit 13 is different. Other configurations are the same as the second embodiment described above, and the description of the first to third embodiments is appropriately incorporated.

The parallel circuit 13 has a sensor 13, a diode 13b, a switching element 13c, a sensor 13d, and a diode 13e. The parallel circuit 13 is connected between lower potential side of the switching element 12 and the connection point A. The conductive direction of the diode 13b and 13e is the direction in which the forward direction current flows from the lower potential side of the switching element 13 to the connection point A. That is, the anode of the diode 13b is connected to the power supply line on the negative electrode side via the switching element 13c, and the cathode of the diode 13b is connected to the power supply line on the positive electrode side. Further, the anode of the diode 13e is connected to the power supply line on the negative electrode side, the cathode of the diode 13e is connected to the power supply line on the positive electrode side. The sensor 13a detects current flowing to diode 13b, and the sensor 13d detects current flowing to diode 13e. The switching element 13c is connected in series with the diode 13b. The diode 13e is connected in parallel to the series circuit of the diode 13b and the switching element 13c.

The controller 3 controls on/off of the switching element 13c using a drive signal similar to the drive signal of the switching element 12. That is, the switching element 12 and the switching element 13c switch on and off synchronously. The controller 3 determines whether or not the forward direction current flows through diode 13a from the detected values of the sensor 13a. The controller 3 determines whether or not the forward direction current flows through the diode 13e from the detected values of the sensor 13d. The controller 3 controls operating condition of the switching element 12 depending on these determined results.

The forward voltage of the diode 13b is lower than the forward voltage of the diode 13e. Further, when the switching element 13c is turned on, so that the current flows through the diode 13b and the current does not flow to the diode 13e, the circuit elements included in the voltage converting circuit is selected.

Figure 13A:
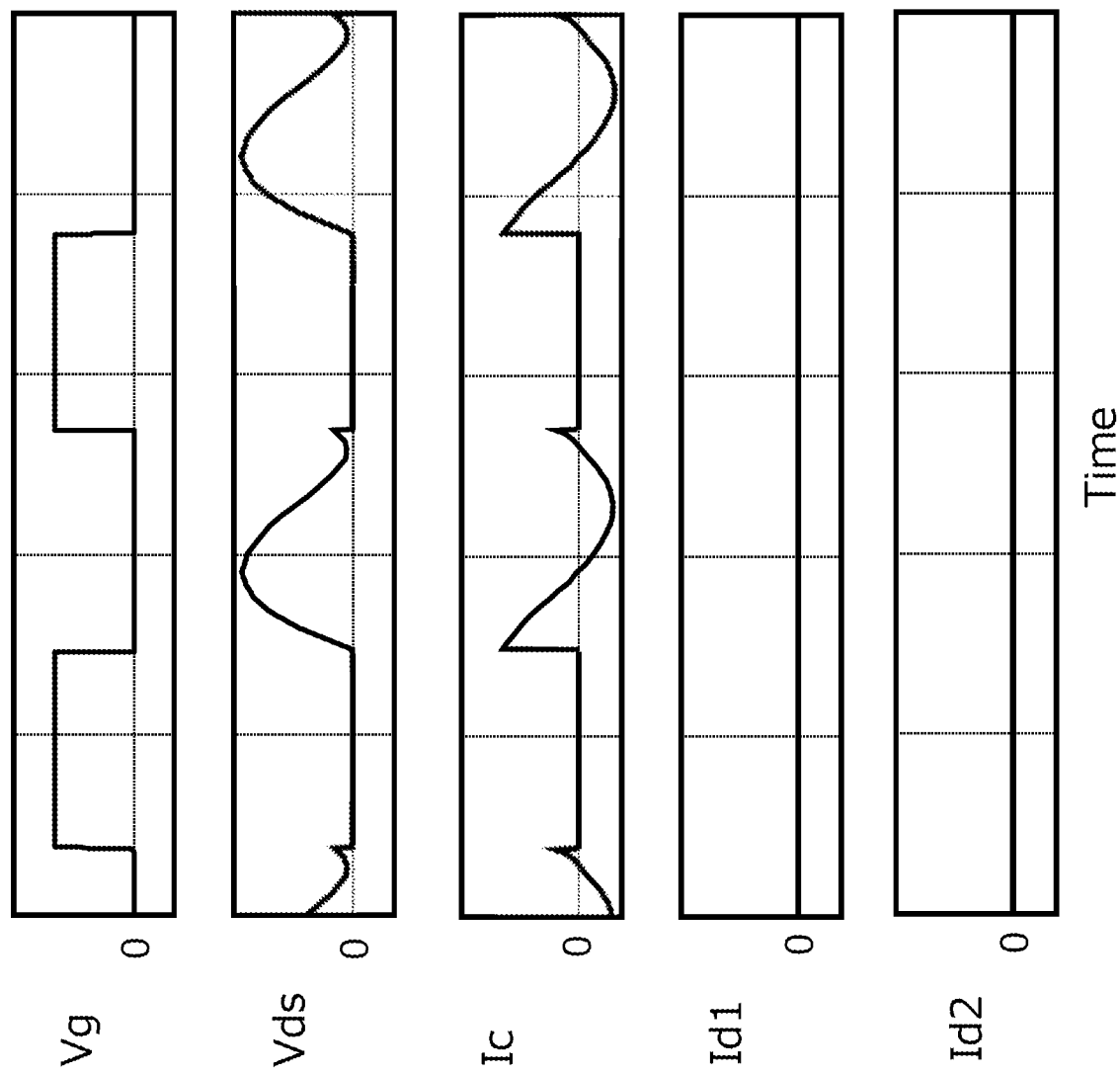
FIG. 13A is a graph showing the voltage current characteristics in the resonance type power conversion device shown in FIG. 12.
Figure 13B:
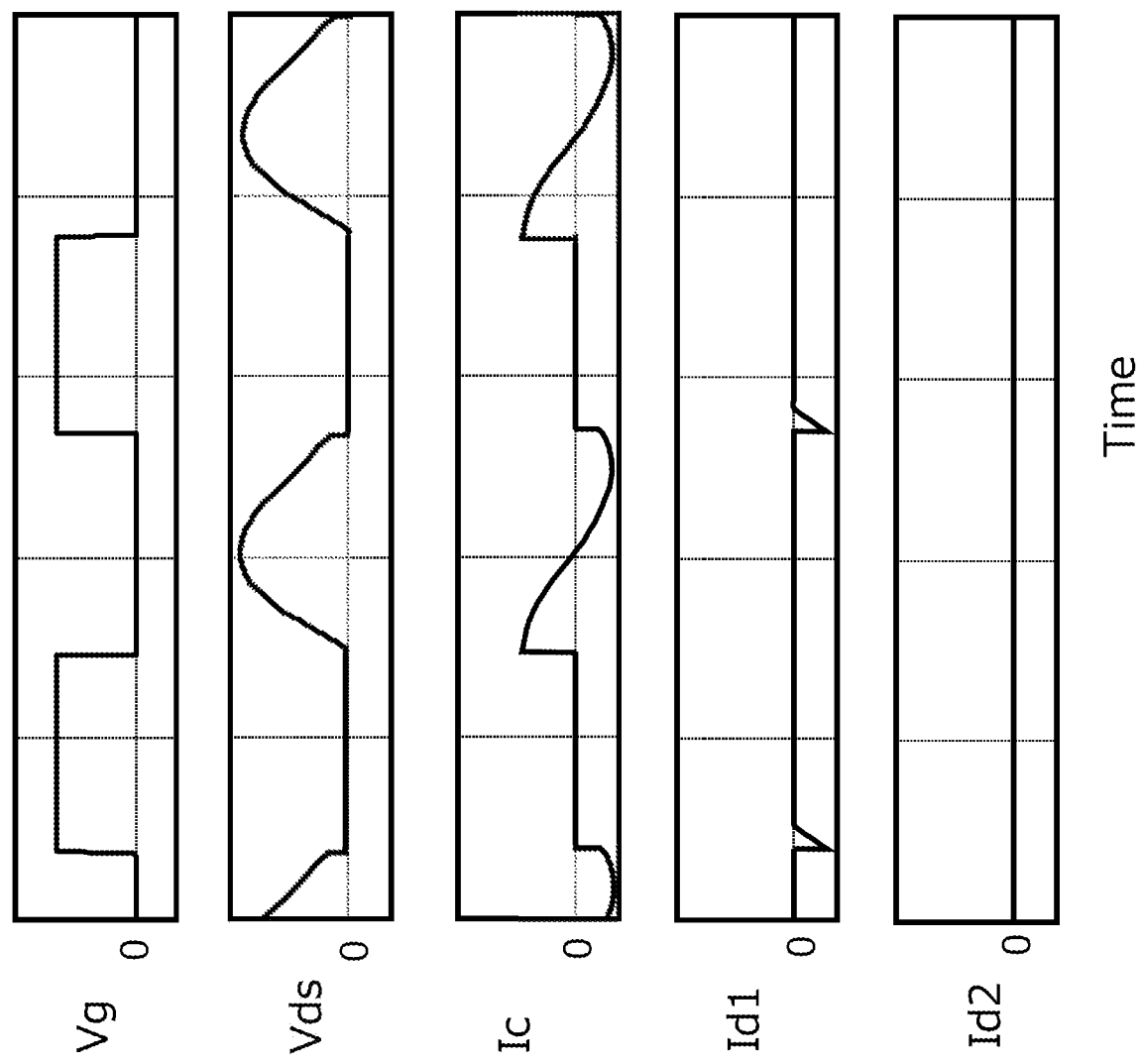
FIG. 13B is a graph showing the voltage current characteristics in the resonance type power conversion device shown in FIG. 12.
Figure 13C:
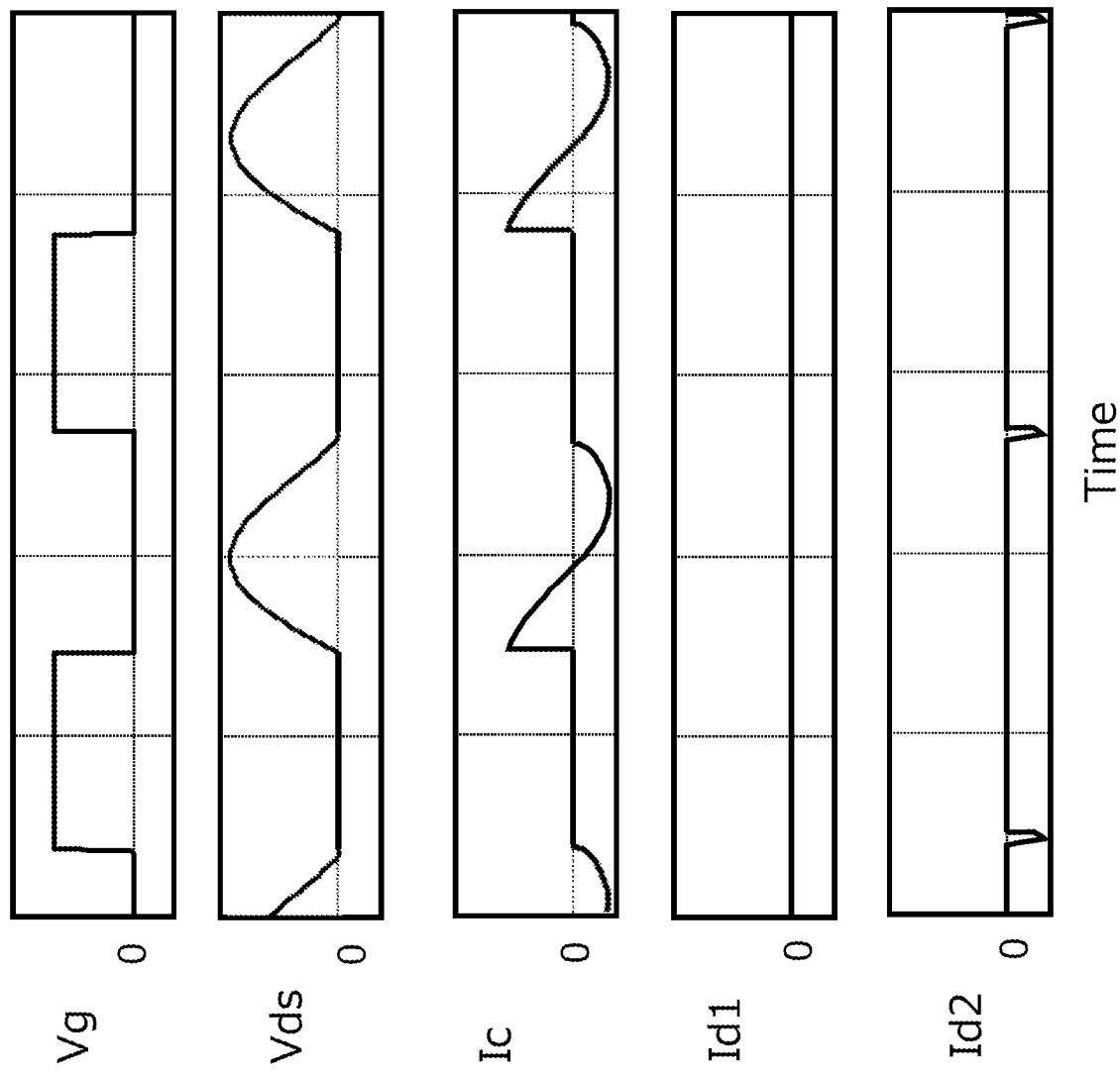
FIG. 13C is a graph showing the voltage current characteristics in the resonance type power conversion device shown in FIG. 12.

Referring to FIGS. 13A-13C, the driving signal (Vg) of the switching element 12, the voltage (Vds) across switching element 12, the current (Ic) flowing through the capacitor 14, and the current (Id1, Id2) flowing through the diode 13b, 13e is explained below. FIGS. 13A-13C are graphs showing the characteristics of Vg, Vds, Ic, Id1, and Id2.

FIGS. 13A and 13B show the voltages and current waveforms when ZVS is not satisfied. FIG. 13C shows the voltages and current waveforms when ZVS is true.

For example, when the capacitance value of the resonant capacitor 15b is decreased and is smaller than the capacitance value of the resonant capacitor 15b at the time of satisfying ZVS, the voltage (Vds) and current (Ic, Id1, Id2) is a waveform as shown in FIG. 13A. On the other hand, for example, when the capacitance value of the resonant capacitor 15b is increased and is larger than the capacitance value of the resonant capacitor 15b at the time satisfying ZVS, the voltage (Vds) and current (Ic, Id1, Id2) is a waveform as shown in FIG. 13B.

As shown in FIG. 13C, the current flows to the diode 13e when ZVS is satisfied, but the current does not flow to diode 13e when ZVS is not satisfied, as shown in FIGS. 13A and 13B. As shown in FIG. 13C, since the current flowing through the diode 13e when ZVS is satisfied flows before the switching element 13c is turned on, the forward direction current flows through the diode 13e without flowing to diode 13b.

When ZVS as shown in FIG. 13B is not satisfied, the forward direction current flows to diode 13b and does not flow to diode 13e. In this embodiment, since the forward voltage of the diode 13b is smaller than the forward voltage of the diode 13e, when ZVS is not satisfied, the forward direction current flows to diode 13b, not to diode 13e.

When ZVS is not satisfied as shown in FIG. 13A, the forward direction current does not flow in both diode 13b and diode 13e. That is, controller 3, by detecting whether or not the forward direction current flows through diode 13b, 13e, it can be determined whether the waveforms of the voltages (Vds) and current (Ic, Id1, Ids) are any of the states in FIGS. 13A to 13C.

Figure 14:
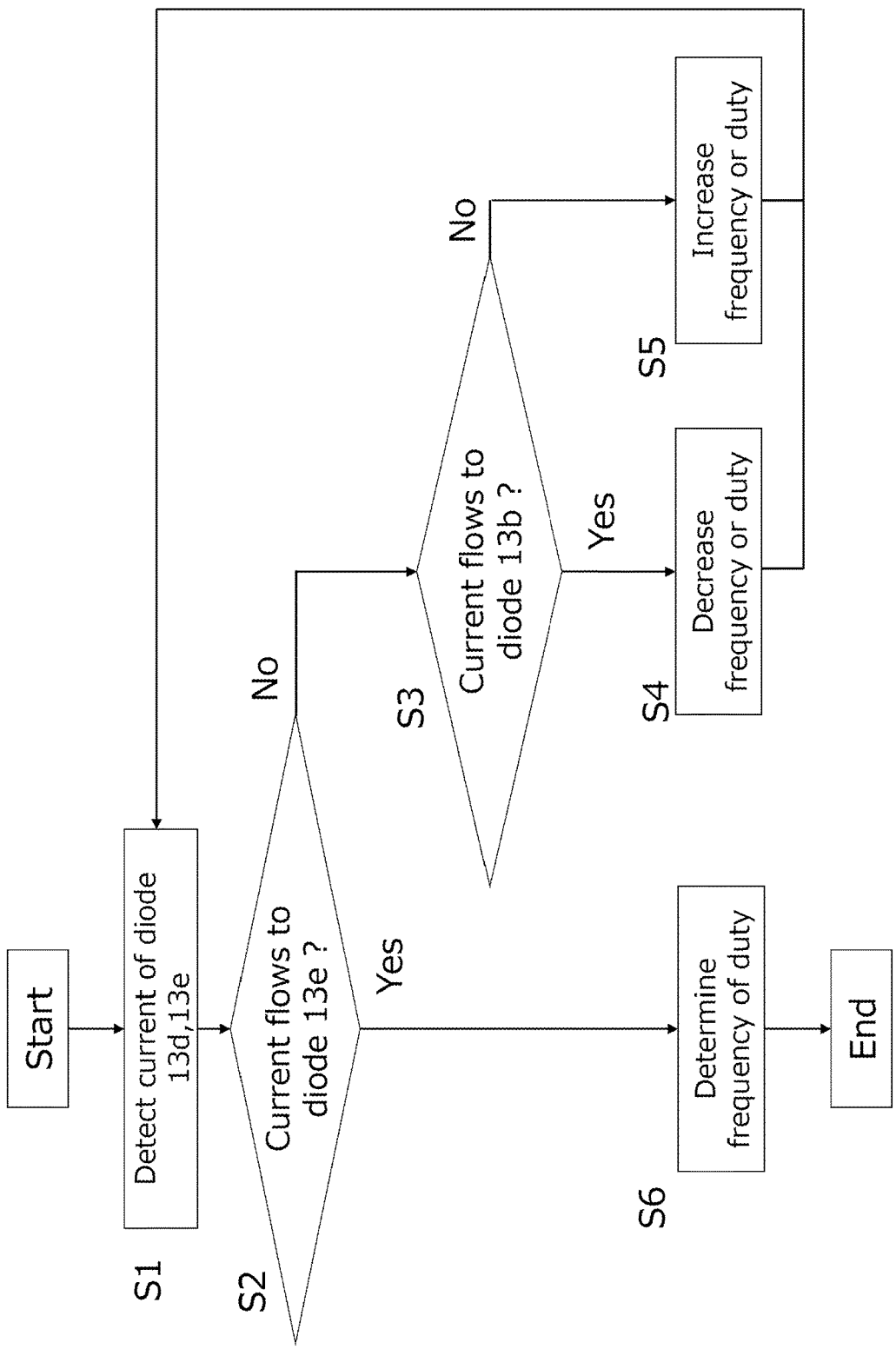
FIG. 14 is a flowchart showing control flows of the controller included in the resonance type power conversion device shown in FIG. 12.

Referring to FIG. 14, the specific control of the controller 3 is explained below. FIG. 14 is a flowchart showing the control flow of the controller 3. The controller 3, by outputting a drive signal of a predetermined period to the control terminal of the switching element 12, cyclically switches turn on-off of the switching element 12. Apart from such switching operation control, the controller 3 executes the following control flows. Note that, the controller 3, when starting the control of the resonance-side power converter, when the operating state of the load 2 fluctuates, or at any timing during operation of the resonance-type power resonance device, executes the control flows shown in FIG. 14.

In step S1, the controller 3 detects the current flowing in parallel circuit 13 by sensor 13a and 13d. In step S2, the controller 3 determines whether the current flows in diode 13e. When the diode current flows, the controller 3 executes the control in step S6. When the forward direction current does not flow the current to diode 13e, in step S3, the controller 3 determines whether or not the current flows to diode 13b. When the forward direction current flows to the diode 13b, in step S4, the controller 3 lowers the frequency of the drive signal below the frequency before the change so that the timing for turning on the switching element 12 is slower than the timing before the change. Then, the process returns to step S1. On the other hand, when the forward direction current does not flow to the diode 13b, in step S5, the controller 3 increases the frequency of the drive signal to be higher than the frequency before the change and makes the timing for turning on the switching element 12 faster than the timing before the change. Then, the process returns to step S1. In step S6, the controller 3 sets the present frequency to the frequency of the drive signal. Thus, the frequency for satisfying the ZVS is decided.

Figure 15:
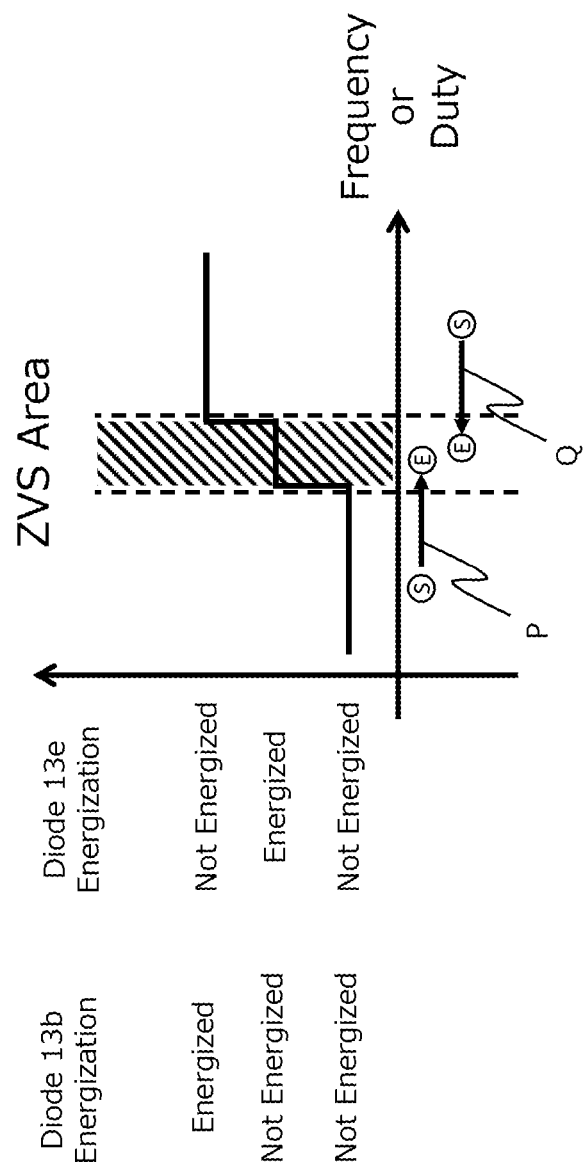
FIG. 15 is a graph for explaining the control of when the ZVS satisfied in the resonance type power conversion device shown in FIG. 12.

Referring to FIG. 15, diode 13b, the conduction state of 13e, the relationship between the frequencies of the driving signals is explained below. In the graph of FIG. 11, the ZVS area represents the region of the driving frequency at which ZVS is satisfied. Also, S indicates the frequency at the time of control start, E indicates the frequency at the time of control end, i.e. the frequency set in the control flow of step S6.

The frequency of the drive signal is gradually increased from a state lower than the frequency at the time of satisfying ZVS, and the frequency of the drive signal is set close to the frequency at the time of satisfying ZVS (corresponding to the arrow P in FIG. 15). A gradual increase in the frequency of the drive signals results in a gradual increase in the timing for turning on the switching element 12. Then, when the frequency of the driving signal reaches the frequency when ZVS is satisfied, the forward direction current starts to flow to the diode 13e. In other words, as shown by the arrow P in FIG. 15, the controller 3 gradually increases the frequency of the drive signal, shifting from a state in which the diode 13b is not energized to the diode 13b is energized is a state in which ZVS is satisfied. Therefore, the controller 3 gradually increases the frequency of the drive signal, by detecting that the forward direction current starts flowing by using the detected value of sensor 13d, the frequency when ZVS is satisfied can be set.

The frequency of the drive signal is gradually lowered from a state higher than the frequency at the time of satisfying ZVS, and the frequency of the drive signal is brought close to the frequency at the time of satisfying ZVS (corresponding to the arrow Q in FIG. 15). A gradual decrease in the frequency of the drive signals results in a gradual decrease in the timing for turning on the switching element 12. Then, when the frequency of the driving signal reaches the frequency when ZVS is satisfied, the forward direction current starts to flow to the diode 13e. In other words, as shown by the arrow Q in FIG. 15, the controller 3 gradually lowers the frequency of the drive signal, shifting from a state in which the diode 13b is not energized to the diode 13b is energized is a state in which ZVS is satisfied. Therefore, the controller 3 can set the frequency when ZVS is satisfied by gradually lowering the frequency of the drive signal and detecting that the forward direction current starts flowing from the detected value of the sensor 13d.

As described above, in this embodiment, polarity of current flowing to the diode 13e is detected while switching element 12 is turned on at timing of the predetermined period, when the forward direction current does not flow to the diode 13e, the timing for turning on the switching element 12 is changed from the timing of the predetermined period, and when the forward direction current flows to the diode 13e, timing for turning on the switching element 12 is not changed from the timing of predetermined period. Thus, ZVS can be continuously performed, it is possible to suppress the switching loss.

Note that, in the present embodiment, the controller 3, in the control flow of step S5, the duty ratio of the driving signal may be increased and is higher than the current duty ratio. Further, the controller 3, in the control flow of step S4, the duty ratio of the driving signals may be lowered than the current duty ratio.

In the present embodiment, the controller 3, in the control flows of steps S4 and S5, may adjust both the frequency and the duty ratio of the drive signals.

Fifth Embodiment

Figure 16:
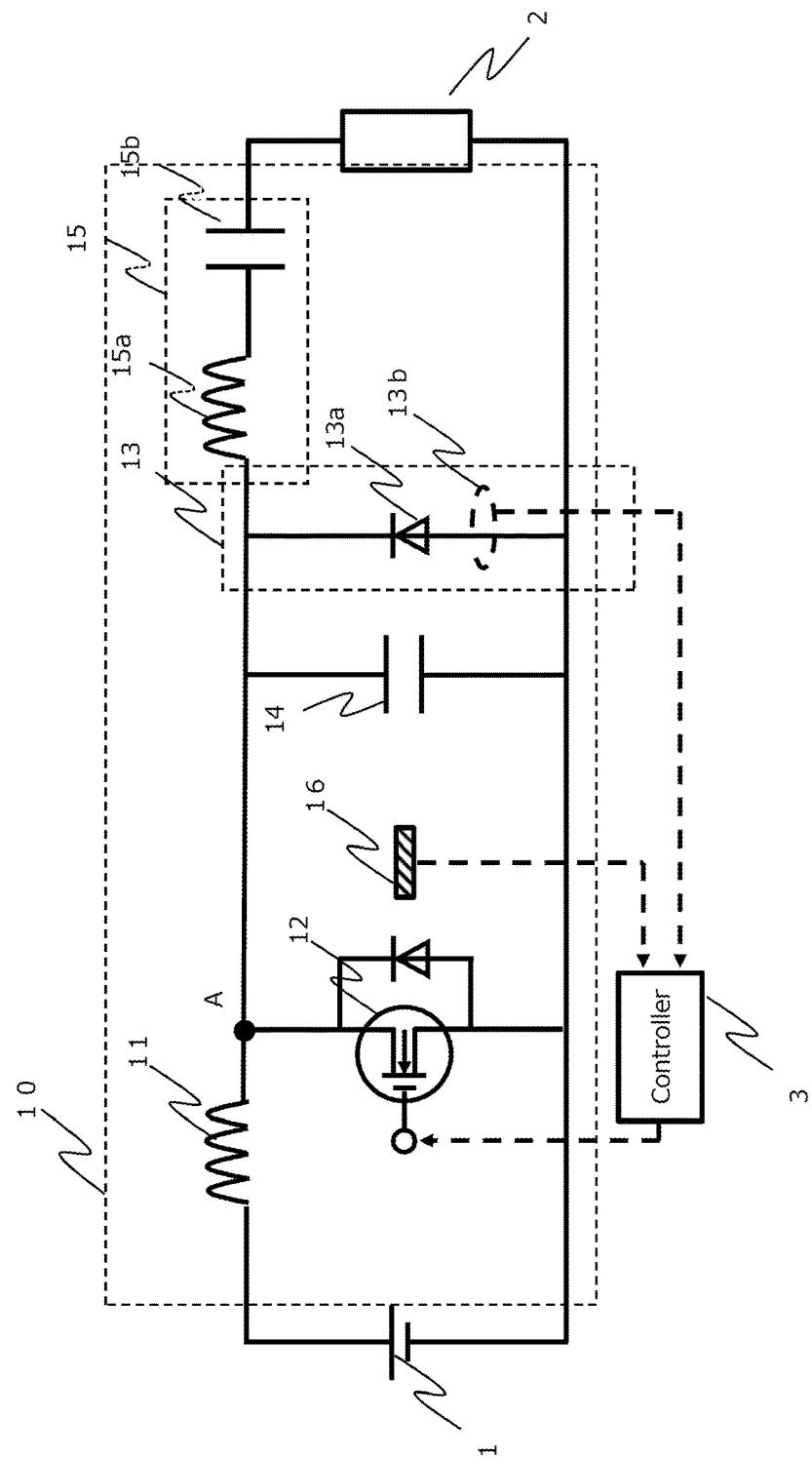
FIG. 16 is a block diagram of a resonance type power conversion device according to another embodiment of the present invention.

FIG. 16 is a block diagram of a resonance type power conversion device according to another embodiment of the present invention. In this example, with respect to the second embodiment described above, the difference is that a temperature sensor 16 is provided. Other configurations are the same as the second embodiment described above, and the descriptions of the first to fourth embodiments are appropriately incorporated.

As shown in FIG. 16, the temperature sensor 16 for detecting the temperature of the switching element 12 is provided. The temperature sensor 16, such as a thermistor is used. The temperature sensor 16 outputs the detected value to the controller 3. The controller 3 controls operating condition of the switching element 12 depending on the detected values of the sensor 13b and the temperature sensor 16 of sensor.

When ZVS is not satisfied, the switching loss increases and the temperature of the switching element 12 rises. Therefore, the controller 3 can determine whether ZVS is satisfied based on detection temperature. When it is determined that ZVS is not satisfied, the controller 3 controls operating condition of the switching element 12 depending on polarity of the current flowing to diode 13b.

Figure 17:
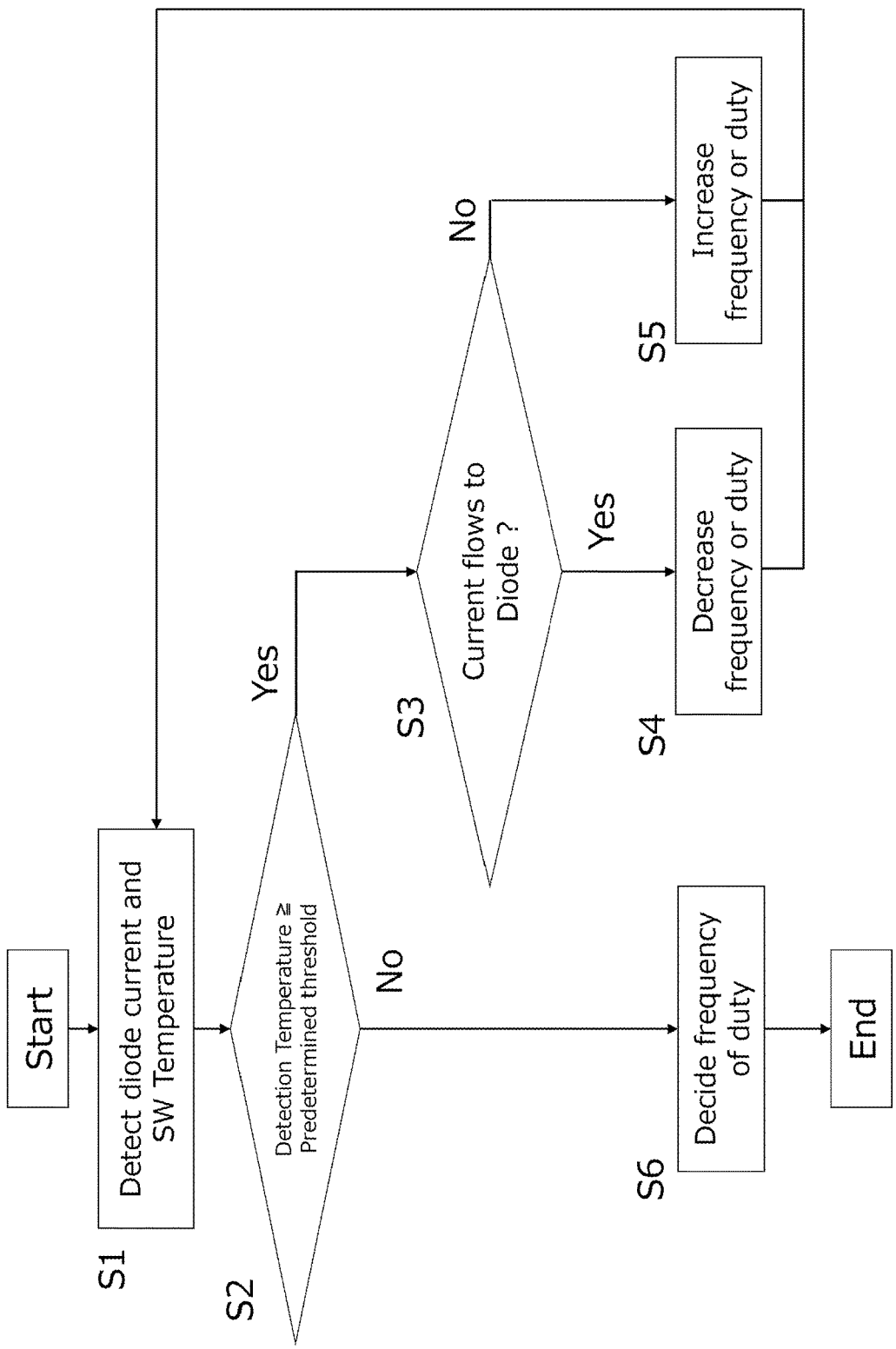
FIG. 17 is a flowchart showing control flows of the controller included in the resonance type power conversion device shown in FIG. 16.

Referring to FIG. 17, the specific control of the controller 3 is explained. FIG. 17 is a flowchart showing the control flows of the controller 3. The controller 3, by outputting a drive signal of a predetermined period to the control terminal of the switching element 12, cyclically switches the turn on-off of the switching element 12. Apart from such switching operation control, the controller 3 executes the following control flows. Note that, the controller 3, when starting the control of the resonance-side power converter, when the operating state of the load 2 fluctuates, or, at any timing during operation of the resonance-type power resonance device, executes the control flows shown in FIG. 17.

In step S1, the controller 3 detects current flowing to diode 13a by the sensor 13b, and detects temperature of the switching element 12 by the temperature sensor 16. In step S2, the controller 3 determines whether or not detection temperature is equal to or greater than a predetermined threshold. When the detection temperature is less than a predetermined threshold, the controller 3 performs the control of step S6. When the detection temperature is equal to or greater than a predetermined threshold value, in step S3, the controller 3 determines whether or not current flows to diode 13a. When the forward direction current is flows to diode 13a, in step S4, the controller 3 lowers the frequency of the drive signals below the frequency before the change so that the timing for turning on the switching element 12 is slower than timing before the change. Then, the process returns to step S1. On the other hand, if the forward direction current is not flowing to diode 13a, in step S5, The controller 3 increases the frequency of the drive signal above the frequency before the change and makes timing to turn on switching element 12 faster than timing before the change. Then, the process returns to step S1. In step S6, The controller 3 sets the present frequency to the frequency of the drive signal. Thus, the frequency for satisfying the ZVS is decided.

In this embodiment, as described above, when detection temperature of the switching element 12 is equal to or greater than a predetermined temperature threshold while switching element 12 is turned turn on at timing of predetermined period, timing that causes switching element 12 to turn on is changed from timing of predetermined period, and when detection temperature of the switching element 12 is less than a predetermined temperature threshold, timing that causes switching element 12 to turn on is not changed from timing of predetermined period. Thus, ZVS can be continuously performed, it is possible to suppress the switching loss.

In the present embodiment, the controller 3, in the control flow of step S5, the duty ratio of the driving signal may be increased from the current duty ratio. Further, the controller 3, in the control flow of step S4, the duty ratio of the driving signals may be lowered than the current duty ratio.

In the present embodiment, the controller 3, the control flow of the control flow and step S5 in step S4, may be adjusted both the frequency and the duty ratio of the drive signals.

Sixth Embodiment

Figure 18:
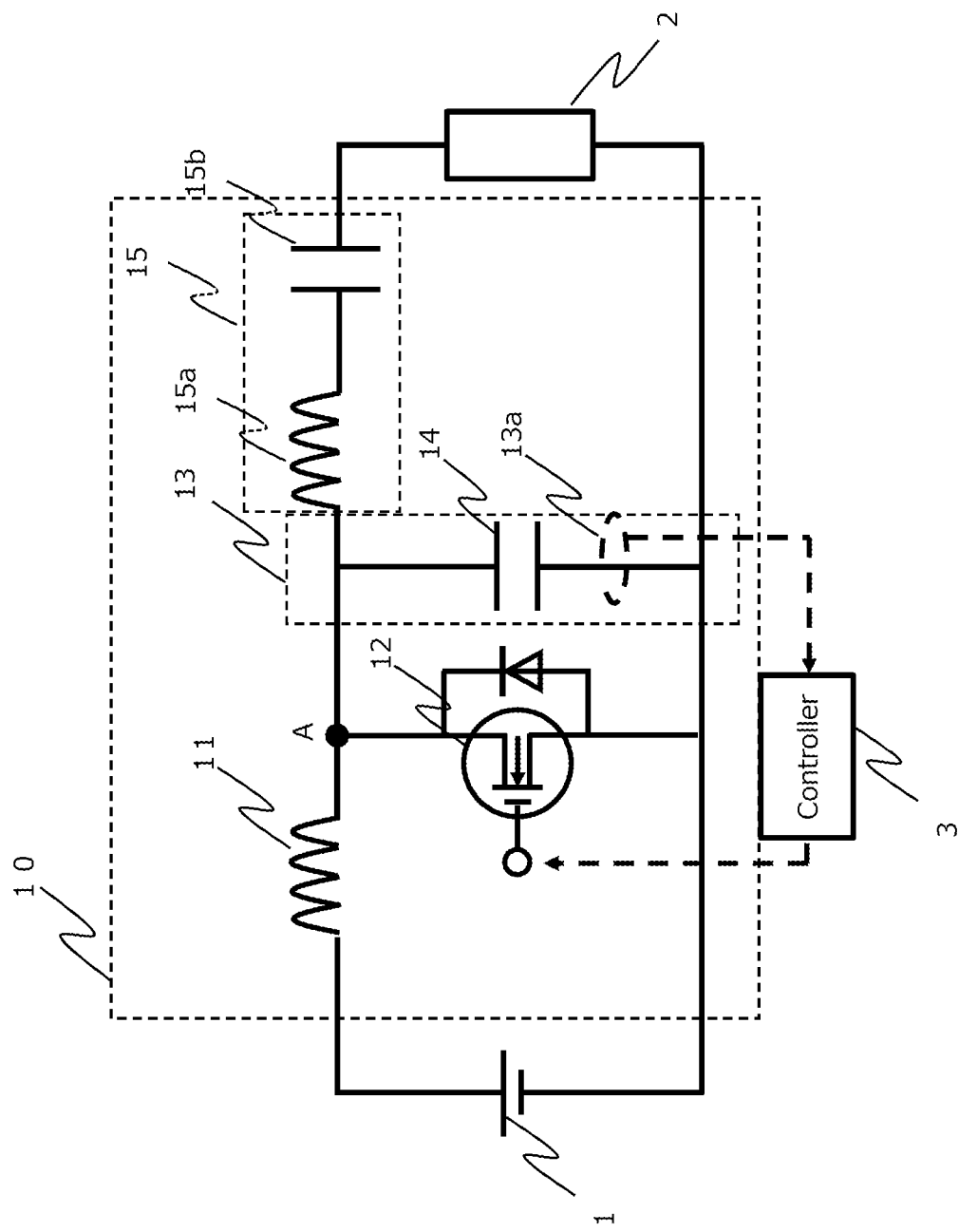
FIG. 18 is a block diagram of the resonance type power conversion device according to another embodiment of the present invention.

FIG. 18 is a block diagram of a resonance type power conversion device according to another embodiment of the present invention. In this example, with respect to the first embodiment described above in this example, the difference is that a capacitor 14 is included in parallel circuit 13. Other configurations are the same as the first embodiment described above, and the description of the first to fifth embodiments are appropriately incorporated.

As shown in FIG. 18, parallel circuit 13 has a sensor 13a and a capacitor 14. The sensor 13a detects current flowing in capacitor 14.

Figure 19A:
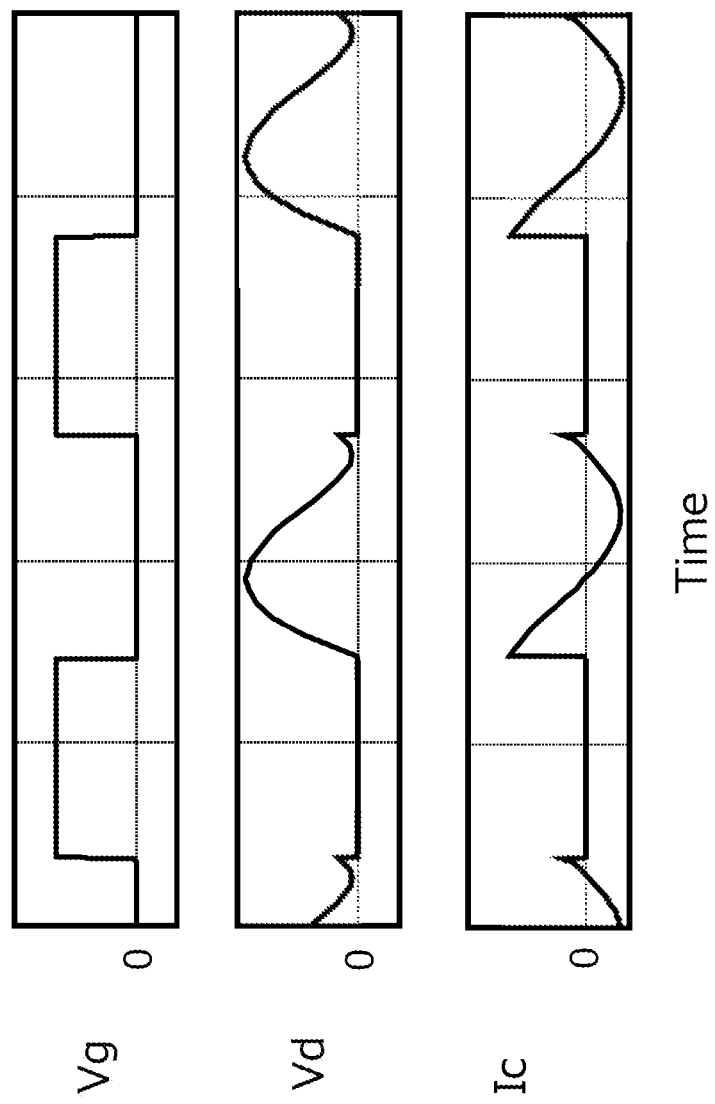
FIG. 19A is a graph showing the voltage current characteristics in the resonance type power conversion device shown in FIG. 18.
Figure 19B:
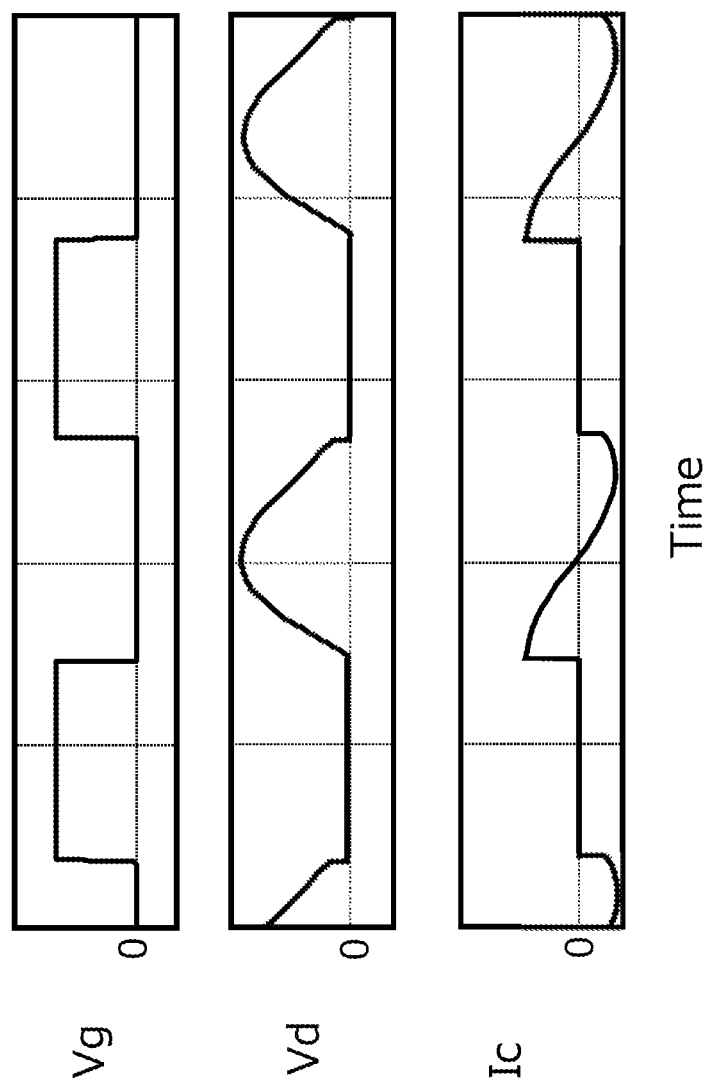
FIG. 19B is a graph showing the voltage current characteristics in the resonance type power conversion device shown in FIG. 18.

Referring to FIGS. 19A and 19B, the driving signal of the switching element 12 (Vg), the voltage (Vds) according to both ends of the switching element 12, and current (Ic)

flowing through capacitor 14 is explained below. FIGS. 19A and 19B are graphs showing the characteristics of Vg, Vds, Ic.

FIGS. 19A and 19B show the voltages and current waveforms when ZVS is not satisfied. For example, when the capacitance value of the resonant capacitor 15*b* is reduced from the capacitance value of the resonant capacitor 15*b* when the ZVS is satisfied, the voltage (Vds) and current (Ic) is a waveform as shown in FIG. 19A. On the other hand, for example, when the capacitance value of the resonant capacitor 15*b* is increased from the capacitance value of the resonant capacitor 15*b* when satisfied ZVS, the voltage (Vds) and current (Ic) is a waveform as shown in FIG. 19B.

When ZVS as shown in FIG. 19A is not satisfied, current flowing to capacitor 14 is positive direction just before switching element 12 is turned turn on. On the other hand, when ZVS as shown in FIG. 19B is not satisfied, current flowing to capacitor 14 becomes negative direction just before switching element 12 becomes turn on. That is, the controller 3, immediately before switching element 12 is turned turn on, by detecting polarity of current flowing in capacitor 14, the voltage (Vds) and current (Ic) waveforms can be determined whether the state of FIG. 19A, 19B.

Figure 20:
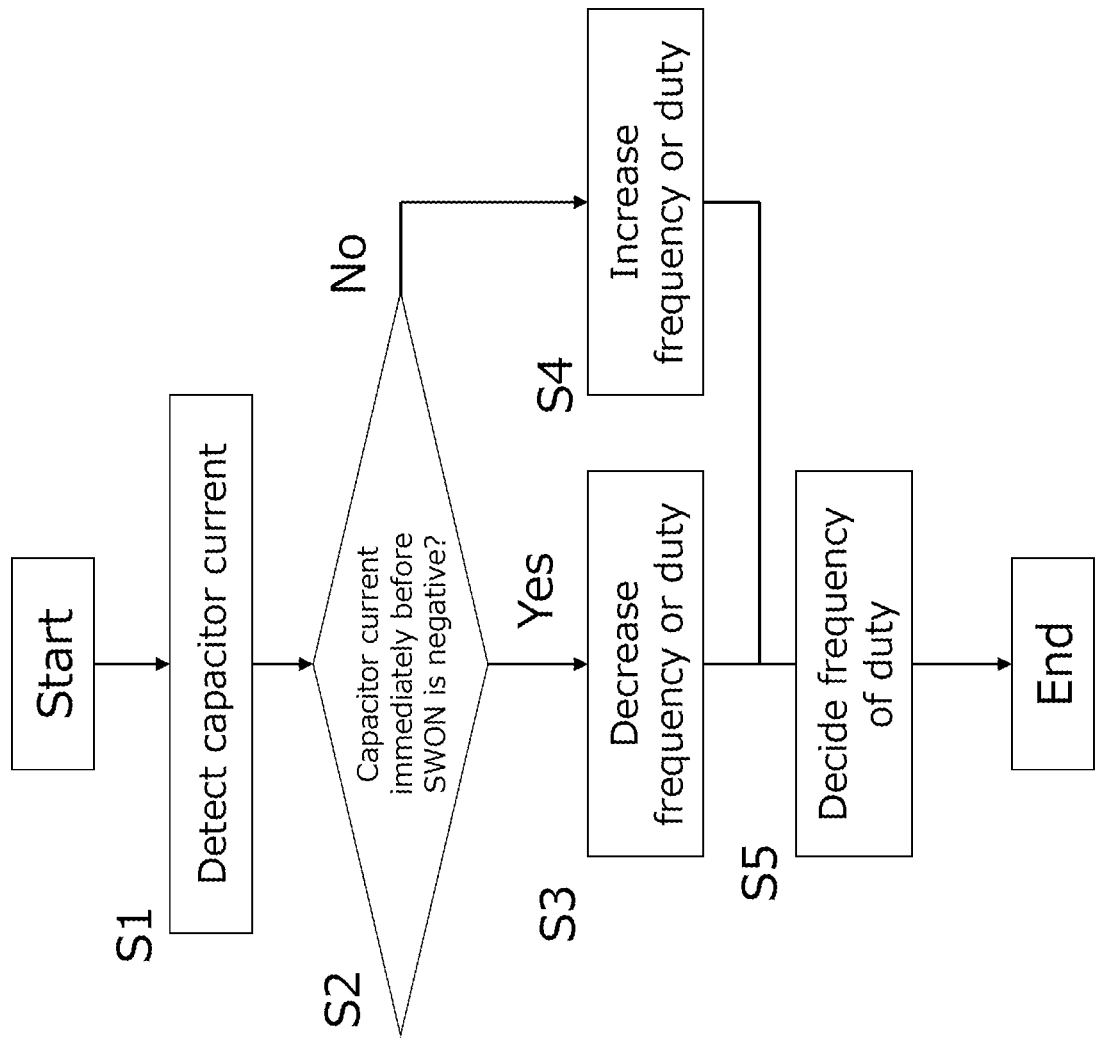
FIG. 20 is a flowchart showing control flows of the controller included in the resonance type power conversion device shown in FIG. 18.

Referring to FIG. 20, the specific control of the controller 3 is explained. FIG. 20 is a flowchart illustrating a control flow of the controller 3. The controller 3, by outputting a drive signal of a predetermined period to the control terminal of the switching element 12, cyclically switches the on-off of the switching element 12. Apart from such switching operation control, the controller 3 executes the following control flows. Incidentally, the controller 3, when starting the control of the resonance-side power converter, when the operating state of the load 2 fluctuates, or, at any timing during operation of the resonance-type power resonance device, executes the control flow shown in FIG. 20.

In step S1, the controller 3 detects current flowing to capacitor 14 by sensor 13*a*. In step S2, the controller 3 determines whether or not current (capacitor current) of capacitor 14 flowing immediately before the switching element 12 is turned on in negative direction. When capacitor current of negative direction is flowing, since the voltage across switching element 12 is in the state shown in FIG. 19B, in step S3, the controller 3 makes the frequency of the drive signal lower than the frequency before the change and timing to turn on switching element 12 slower than timing before the change. When capacitor current of positive direction is flowing, since the voltage across switching element 12 is in the state of FIG. 19A, in step S4, the controller 3 increases the frequency of the drive signal above the frequency before the change and makes timing to turn on switching element 12 faster than timing before the change. In step S5, the controller 3 sets the frequency after the change to the frequency of the drive signal.

As described above, in this embodiment, immediately before turning on the switching element 12 at timing of predetermined period, it detects polarity of capacitor current flowing to capacitor 14 contained in parallel circuit 13. When a direction of the capacitor current is positive direction, timing for turning on the switching element 12 is faster than timing of predetermined period. When direction of the capacitor current is negative direction, timing for turning on the switching element 12 is slower than timing of predetermined period. Thus, ZVS can be continuously performed, it is possible to suppress the switching loss.

In the present embodiment, the controller 3, in the control flow of step S4, the duty ratio of the driving signal may be increased is higher than the current duty ratio. Further, the controller 3, in the control flow of step S3, may lower the duty ratio of the driving signals than the current duty ratio.

In the present embodiment, the controller 3, in the control flows of the steps S3 and S4, may adjust both the frequency and the duty ratio of the drive signals.

In the present embodiment, capacitor 14 is used as the capacitance component connected in parallel with the switching element 12, it is also possible to attach the element having a new capacitance component in addition to capacitor 14.

Seventh Embodiment

Another embodiment of the present invention is explained. In the present embodiment, with respect to the sixth embodiment described above, a part of the control flow is different. Other configurations are the same as the sixth embodiment described above, and the descriptions of the first to sixth embodiments are appropriately incorporated.

Figure 21:
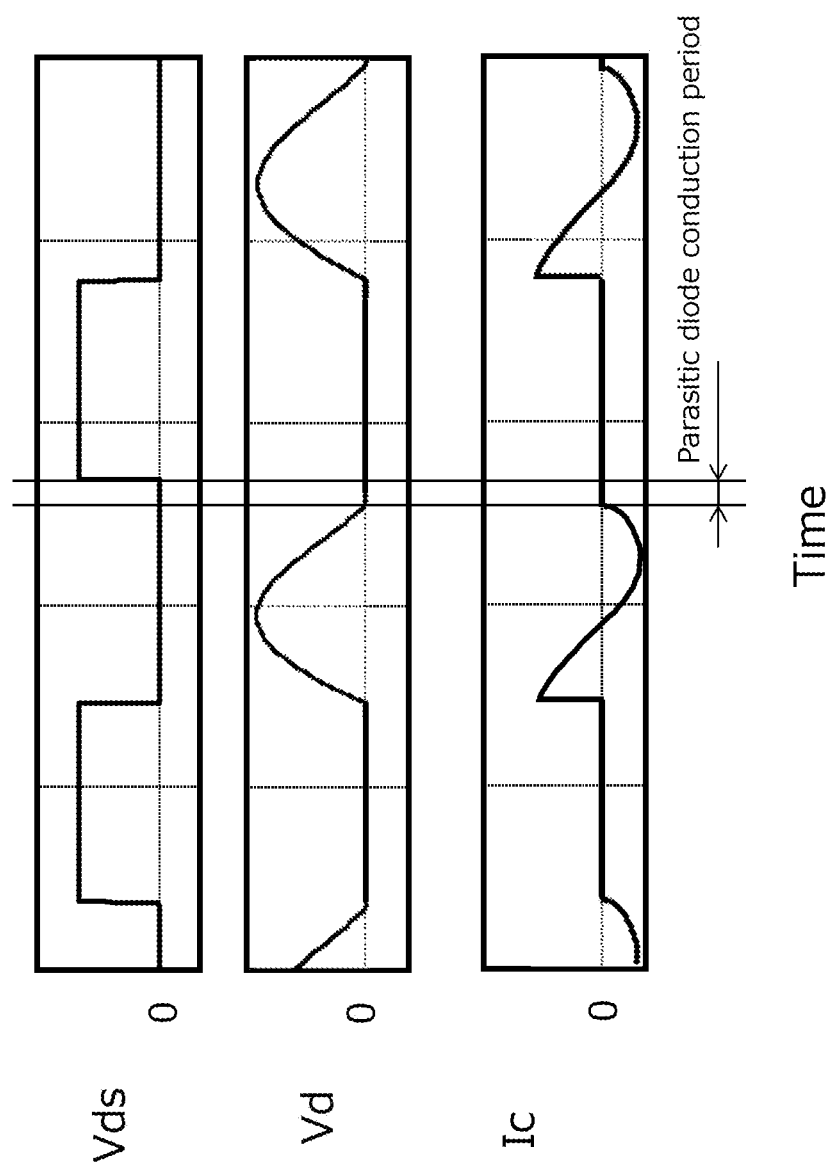
FIG. 21 is a graph showing the voltage current characteristics in the resonance type power conversion device according to another embodiment of the present invention.

FIG. 21 is a graph showing the characteristics of the voltage (Vg, Vds) and current (Ic, Id) when satisfied ZVS. Vg denotes the gate voltage of the switching element 12, Vds denotes the voltage across the switching element 12, Ic denotes current flowing to capacitor 14.

As shown in FIG. 21, when ZVS is satisfied, current does not flow to the capacitor 14 just before turning on the switching element 12. This is because the parasitic diode of the switching element 12 conducts and current flows to the parasitic diode during the period from when the voltage across the switching element 12 drops to zero to when the device is turned on (parasitic diode conduction period in FIG. 21).

Figure 22:
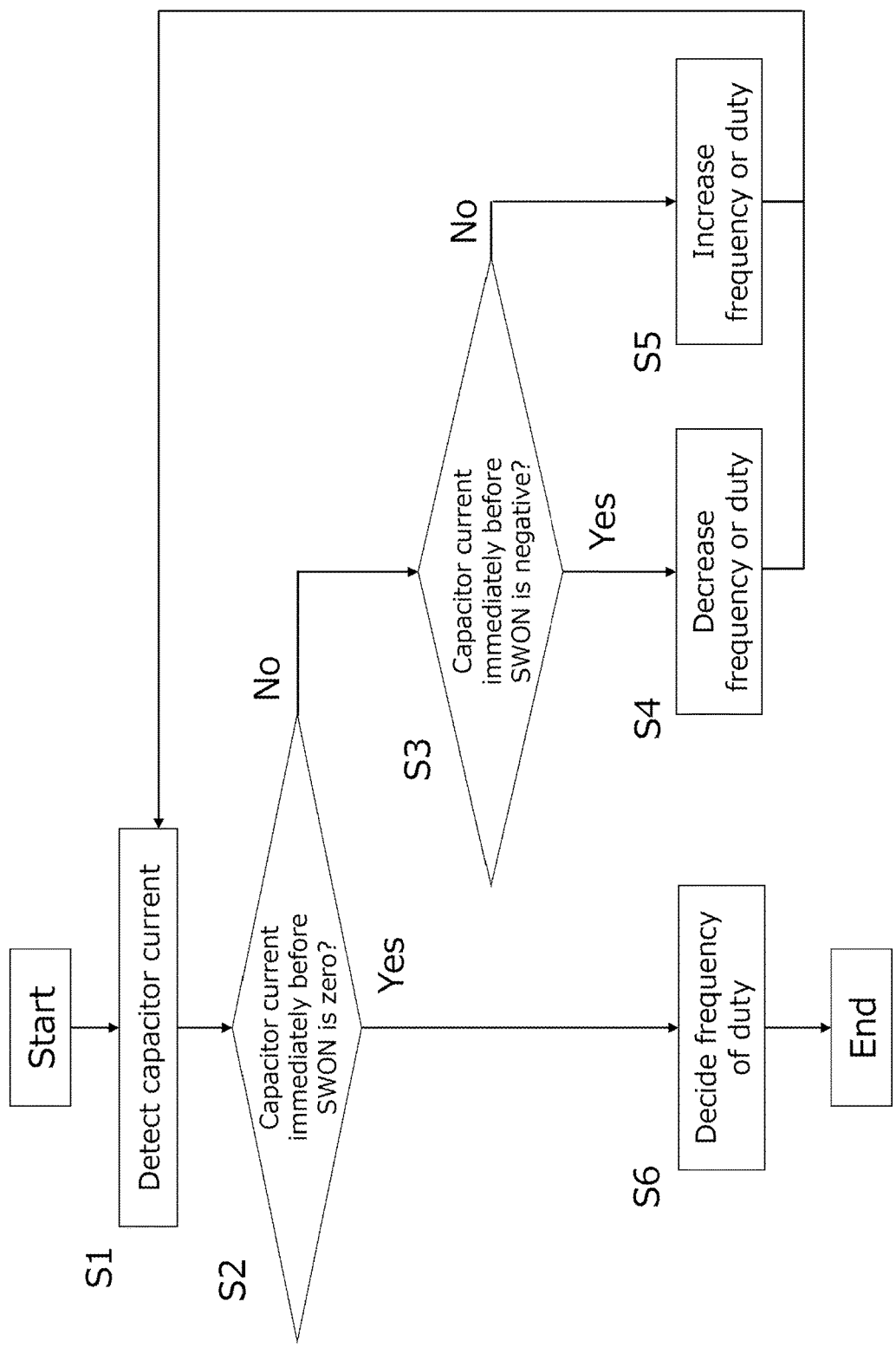
FIG. 22 is a flowchart illustrating control flows of the controller included in the resonance type power conversion device according to an embodiment of the present invention.

Referring to FIG. 22, the specific control of the controller 3 is explained. FIG. 22 is a flowchart illustrating control flows of the controller 3. The controller 3, by outputting a drive signal of a predetermined period to the control terminal of the switching element 12, cyclically switches turn on-off of the switching element 12. Apart from such switching operation control, the controller 3 executes the following control flows. Note that, the controller 3, when starting the control of the resonance-side power converter, when the operating state of the load 2 fluctuates, or, at any timing during operation of the resonance-type power resonance device, executes the control flows shown in FIG. 22.

In step S1, the controller 3 detects current flowing to capacitor 14 by sensor 13*a*. In step S2, the controller 3 determines whether or not capacitor current is zero immediately before turning on the switching element 12. When the capacitor current is zero, the controller 3 performs the control in step S6. When the capacitor current flows, in step S3, the controller 3 determines whether or not the capacitor current of negative direction flows. When negative direction's capacitor current flows, in step S4, the controller 3 lowers the frequency of the drive signal below the frequency before the change so that timing for turning on the switching element 12 slows than timing before the change. Then, the process returns to step S1. On the other hand, when capacitor current of positive direction is flowing, in step S5, the controller 3 increases the frequency of the drive signal above the frequency before the change so that timing for turning on the switching element 12 is faster than timing before the change. Then, the process returns to step S1. In step S6, the controller 3 sets the present frequency to the frequency of the drive signal. Thus, the frequency for satisfying the ZVS is determined.

Figure 23:
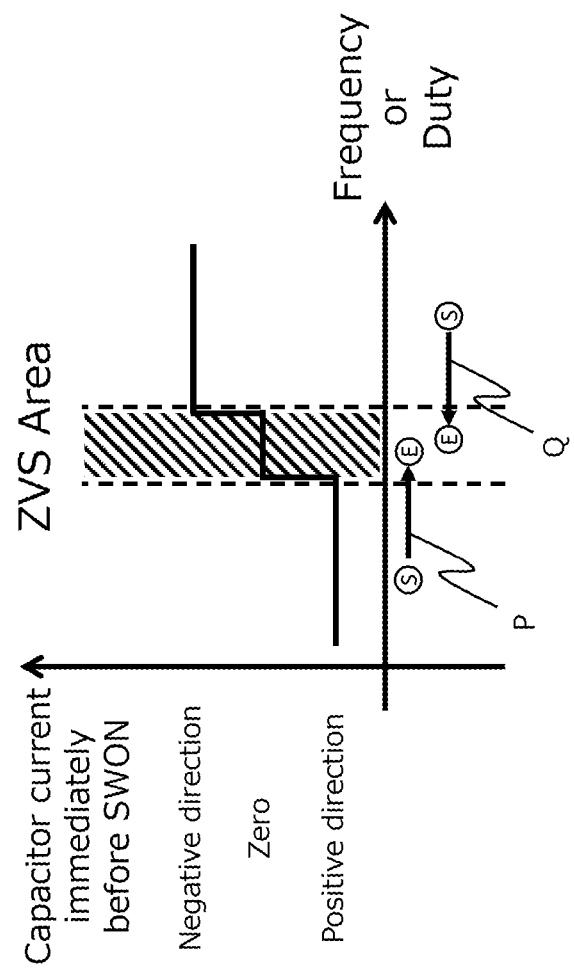
FIG. 23 is a graph for explaining the control of the ZVS satisfied in the resonance type power conversion device according to another embodiment of the present invention.

Referring to FIG. 23, the conductivity of capacitor 14 and the relationship between the frequencies of the drive signals is explained below. In the graph of FIG. 23, the ZVS area represents the region of the driving frequency at which ZVS is satisfied. Also, S indicates the frequency at the time of control start, E indicates the frequency at the time of control end, i.e. the frequency set in the control flow of step S6.

The frequency of the drive signal is gradually increased from a state lower than the frequency at the time of satisfying ZVS, and the frequency of the drive signal is close to the frequency at the time of satisfying ZVS (corresponding to the arrow P in FIG. 22). A gradual increase in the frequency of the drive signals results in a gradual increase in timing for turning on the switching element 12. When the frequency of the driving signal reaches to the frequency when ZVS is satisfied, the capacitor current changes from positive to zero. In other words, as shown by the arrow P in FIG. 22, when the controller 3 gradually increases the frequency of the driving signal and current of capacitor 14 shifts from positive to zero, ZVS is satisfied. Therefore, the controller 3 can set the frequency when ZVS is satisfied by gradually increasing the frequency of the drive signal and detecting that current of capacitor 14 shifts from positive to zero.

The frequency of the drive signal is gradually lowered from a state higher than the frequency at the time of satisfying ZVS, and the frequency of the drive signal is close to the frequency at the time of satisfying ZVS (corresponding to the arrow Q in FIG. 23). A gradual decrease in the frequency of the drive signals results in a gradual decrease in timing for turning on the switching element 12. When the frequency of the driving signal reaches the frequency at the time ZVS is satisfied, current of the capacitor 14 changes from negative to zero. In other words, as shown by the arrow Q in FIG. 23, when the controller 3 gradually lowers the frequency of the driving signal, when current of the capacitor 14 becomes zero from negative, ZVS is satisfied. Therefore, the controller 3 can set the frequency when ZVS is satisfied by gradually lowering the frequency of the drive signal and detecting that current of capacitor 14 changes from negative to zero.

As described above, in this embodiment, when capacitor current does not flow, timing for turning on the switching element 12 is set to timing of predetermined period. Thus, ZVS can be continuously performed, it is possible to suppress the switching loss.

In the present embodiment, the controller 3, in the control flow of step S5, the duty ratio of the driving signal may be increased from the current duty ratio. Further, the controller 3, in the control flow of step S4, the duty ratio of the driving signals may be lowered than the current duty ratio.

Note that, in the present embodiment, the controller 3, in the control flows of steps S4 and S5, may adjust both the frequency and the duty ratio of the drive signals.

EXPLANATIONS OF LETTERS OR NUMERALS

1 Input power supply
2 Load
3 Controller
10 Voltage resonance circuit
11 Choke coil
12 Switching element
13 Parallel circuit
13a Sensor
13 Diode
13c Switching element
13d Sensor
13e Diode
14 Capacitor
15 Resonance circuit
15a Resonant coils
15b Resonant capacitor
16 Temperature sensor

The invention claimed is:

1. A control method of controlling a resonance type power conversion device including a voltage resonance circuit, the method comprising:
    providing the voltage resonance circuit, which comprises:
        a choke coil connected to an input power supply,
        a first switching element connected to the choke coil,
        a capacitor connected in parallel to the first switching element,
        a resonance circuit connected between a connection point and an output terminal, the connection point being a point at which the choke coil and the first switching element are connected, and
        a parallel circuit connected in parallel to the first switching element, wherein:
        the parallel circuit includes a diode connected between a lower potential side of the first switching element and the connection point, and
        a conductive direction of the diode is a direction in which a forward direction current flows from a lower potential side of the first switching element to the connection point;
    detecting, by a sensor, a polarity of a diode current flowing to the diode in a state in which the first switching element is turned on at a timing of a predetermined period;
    when the forward direction current flows to the diode, making a timing for turning on the first switching element later than the timing of the predetermined period; and
    when the diode current is not flowing, making the timing for turning on the first switching element earlier than the timing of the predetermined period.

2. The control method according to claim 1, further comprising, by changing the timing for turning on the first switching element, when becoming a second state from a first state, setting the timing for turning on the first switching element to a timing changed in the second state, the first state being a state in which the forward direction current does not flow to the diode, and the second state being a state in which the forward direction current flows to the diode.

3. A control method of controlling a resonance type power conversion device including a voltage resonance circuit, the method comprising:
    providing the voltage resonance circuit, which comprises:
        a choke coil connected to an input power supply,
        a first switching element connected to the choke coil,
        a capacitor connected in parallel to the first switching element,
        a resonance circuit connected between a connection point and an output terminal, the connection point being a point at which the choke coil and the first switching element are connected, and
        a parallel circuit connected in parallel to the first switching element, wherein:
        the parallel circuit includes a series circuit for connecting a first diode and a second switching element, and a second diode connected in parallel to the series circuit, and a conduction direction of the first diode and the second diode is a direction of a forward current flowing from a low potential side of the first switching element to a connecting point;

in a state in which the first switching element is turned on at a predetermined period, detecting, by a sensor, a polarity of a current flowing to the second diode;

when the forward current does not flow to the second diode, changing a timing for turning on the first switching element from a timing of the predetermined period; and when the forward current flows to the second diode, not changing the timing for turning on the first switching element from the timing of the predetermined period.

4. A control method of controlling a resonance type power conversion device including a voltage resonance circuit, the method comprising:

providing the voltage resonance circuit, which comprises:
a choke coil connected to an input power supply,
a first switching element connected to the choke coil,
a capacitor connected in parallel to the first switching element,
a resonance circuit connected between a connection point and an output terminal, the connection point being a point at which the choke coil and the first switching element are connected, and
a parallel circuit connected in parallel to the first switching element;

detecting, by a sensor, the polarity of the capacitor current flowing to the capacitor included in the parallel circuit, just before the first switching element is turned on at a predetermined period of time;

setting a timing for turning on the first switching element faster than a timing of the predetermined period when a direction of the capacitor current is a positive direction; and setting the timing for turning on the first switching element slower than the timing of the predetermined period when the direction of the capacitor current is a negative direction;

wherein the positive direction is a direction in which the current flows from a high potential side to a low potential side of the capacitor, and the negative direction is a direction in which the current flows from the low potential side to the high potential side.

5. The control method according to claim 4, comprising, setting the timing for turning on the first switching element to the timing of the predetermined period when the capacitor current does not flow.

* * * * *